(12) United States Patent
Fermin et al.

(10) Patent No.: US 12,557,225 B2
(45) Date of Patent: Feb. 17, 2026

(54) CABINET SECURITY ASSEMBLY

(71) Applicant: DISH Wireless L.L.C., Englewood, CO (US)

(72) Inventors: Salim Fermin, Castle Rock, CO (US); Terry Thompson, Tazewell, GA (US); Charles Iversen, Lakewood, CO (US)

(73) Assignee: DISH Wireless L.L.C., Englewood, CO (US)

( * ) Notice: Subject to any disclaimer, the term of this patent is extended or adjusted under 35 U.S.C. 154(b) by 41 days.

(21) Appl. No.: 18/655,085

(22) Filed: May 3, 2024

(65) Prior Publication Data

US 2024/0381547 A1   Nov. 14, 2024

Related U.S. Application Data

(60) Provisional application No. 63/464,822, filed on May 8, 2023.

(51) Int. Cl.
*H05K 5/02* (2006.01)
*E05B 65/48* (2006.01)

(52) U.S. Cl.
CPC ........... *H05K 5/0208* (2013.01); *E05B 65/48* (2013.01)

(58) Field of Classification Search
CPC .............................. E05B 65/48; H05K 5/0208
USPC ........................................................... 70/78
See application file for complete search history.

(56) References Cited

U.S. PATENT DOCUMENTS

| | | | | |
|---|---|---|---|---|
| 4,850,657 A | * | 7/1989 | Placke | H05K 7/20145 |
| | | | | 312/328 |
| 6,983,629 B1 | * | 1/2006 | Gogel | E05C 19/186 |
| | | | | 292/259 R |
| 8,198,553 B2 | * | 6/2012 | Durst | G01G 21/286 |
| | | | | 70/79 |
| 8,917,513 B1 | * | 12/2014 | Hazzard | H05K 5/0208 |
| | | | | 361/826 |
| 2003/0121741 A1 | * | 7/2003 | Japchen | E05B 65/52 |
| | | | | 70/49 |
| 2003/0136159 A1 | * | 7/2003 | Vito | E05C 19/08 |
| | | | | 70/56 |

(Continued)

OTHER PUBLICATIONS

Master Lock Puck Lock, Heavy Duty Hidden Shackle Lock and Hasp, Solid Steel for Vans, M736XKAD, web page downloaded from the Internet on Apr. 28, 2023.

(Continued)

*Primary Examiner* — Nathan Cumar
(74) *Attorney, Agent, or Firm* — Wash Park IP Ltd.; John T. Kennedy

(57) ABSTRACT

Devices, systems and methods for securing an electronics cabinet are disclosed. A first system includes a fixed bracket assembly ("FBA") attached to first electronics cabinet ("EC") panel, a first arm, and a lock bracket assembly ("LBA") attached to a second EC panel. The first arm extends across a third panel of the EC and is attached, at a proximal portion, to the LBA and, at a distal portion, to the FBA. The first arm, when so attached, prevents opening of at least one of the EC panels. The FBA includes a first plate with holes, a first slot, and a second plate. The FBA-FP is placed on the exterior of the first panel. The FBA-SP is placed on the interior of the first panel. The FBA is secured to the first panel by fasteners inserted into the FBA-FP holes, the holes in the first panel, and the FBA-SP holes.

20 Claims, 25 Drawing Sheets

(56) References Cited

U.S. PATENT DOCUMENTS

| | | | | |
|---|---|---|---|---|
| 2004/0107745 A1* | 6/2004 | Williamson | ............. | F41A 9/61 70/2 |
| 2012/0206026 A1* | 8/2012 | Emelio | ................ | E05B 47/004 312/204 |
| 2012/0262041 A1* | 10/2012 | Zhang | .................... | G06F 1/182 312/319.1 |
| 2015/0218859 A1* | 8/2015 | Westwinkel | .......... | E05B 65/464 70/78 |
| 2018/0338380 A1* | 11/2018 | Yeh | .......................... | F16B 7/22 |
| 2021/0372163 A1* | 12/2021 | Wyers | .................... | E05B 65/48 |

OTHER PUBLICATIONS

Puck Lock Options for Cabinets, assortment of web pages identifying various puck lock options.

* cited by examiner

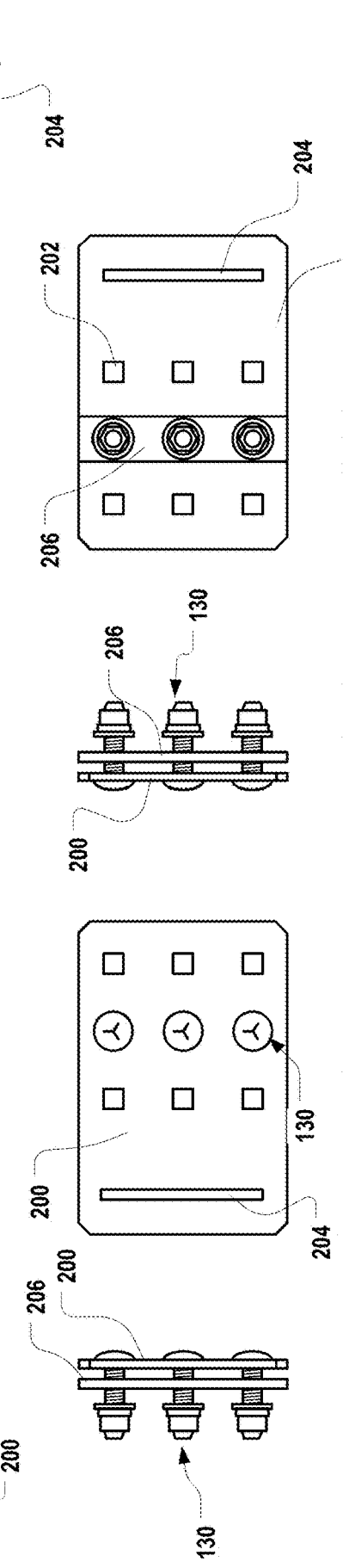

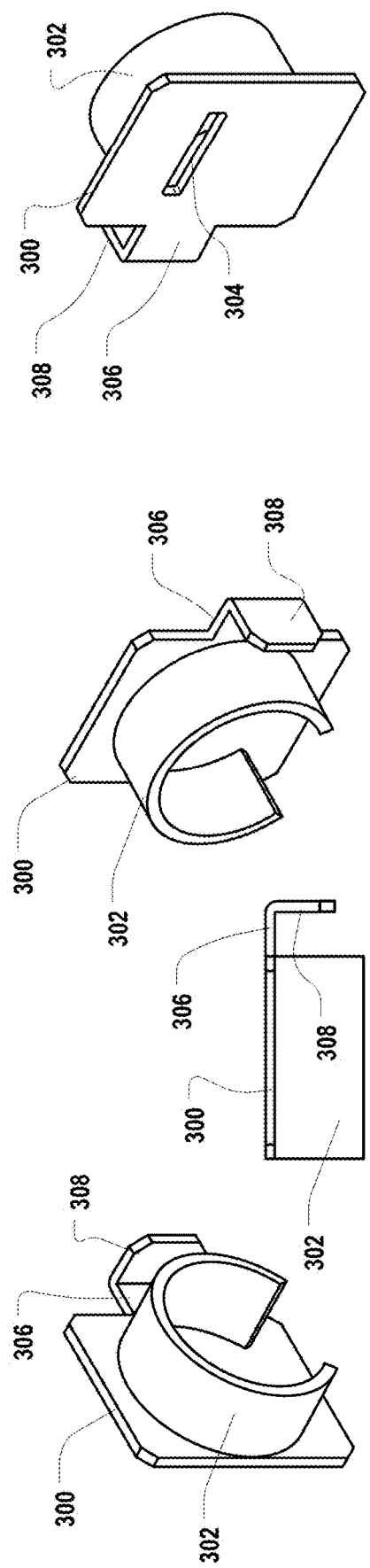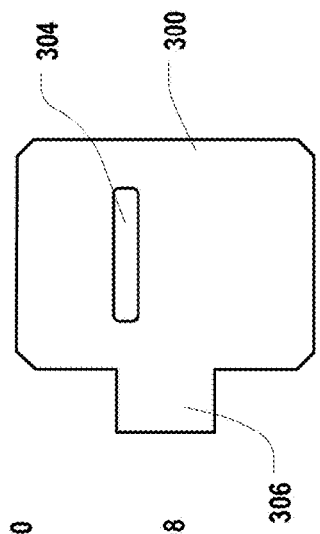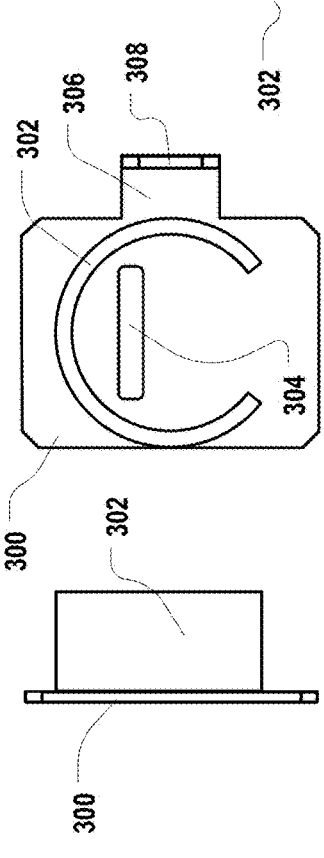

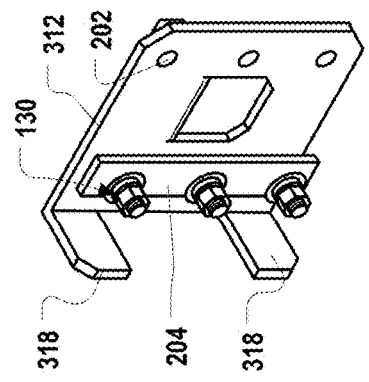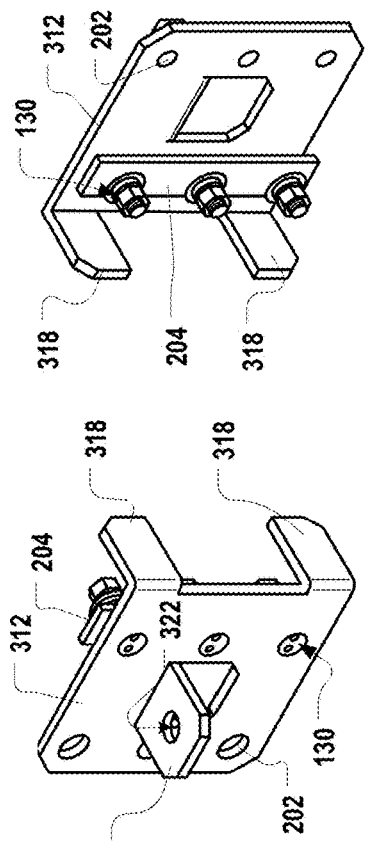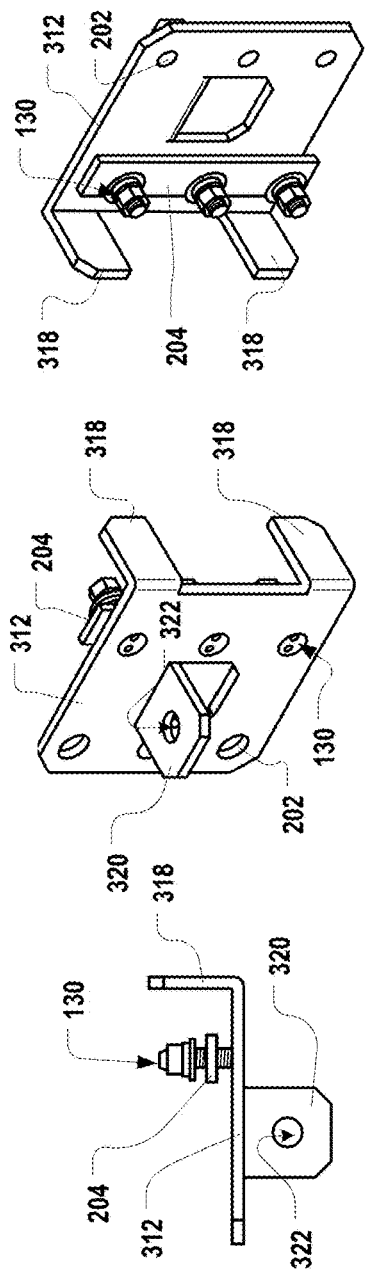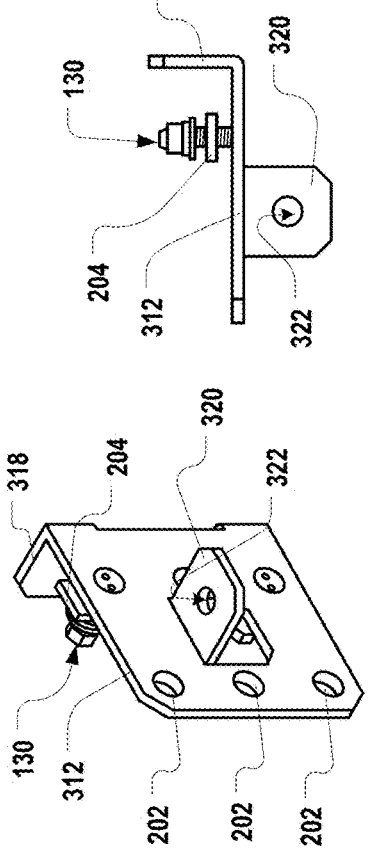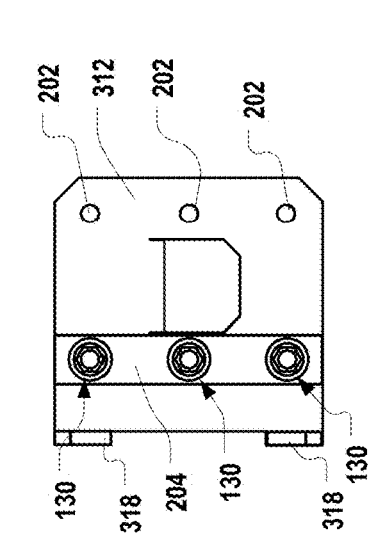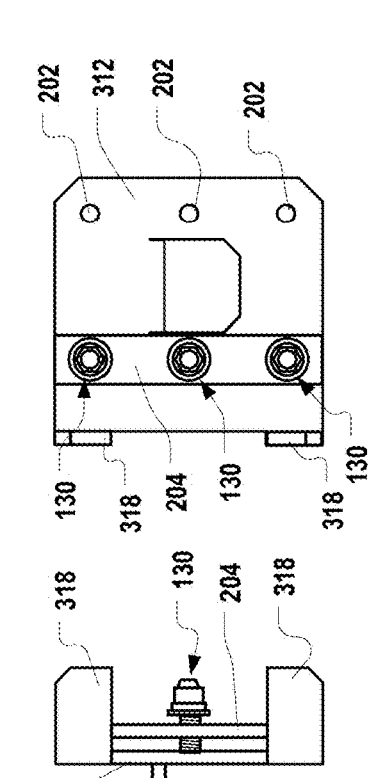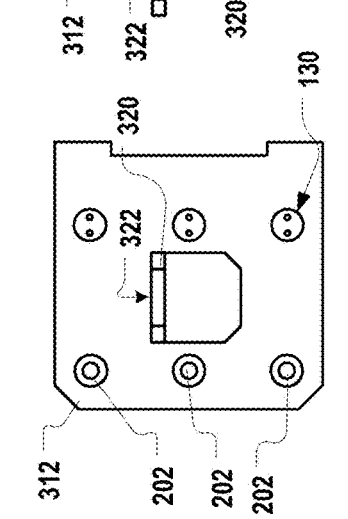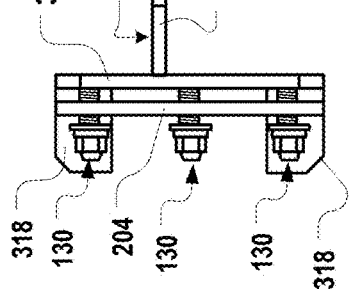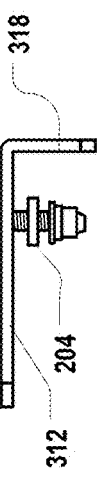

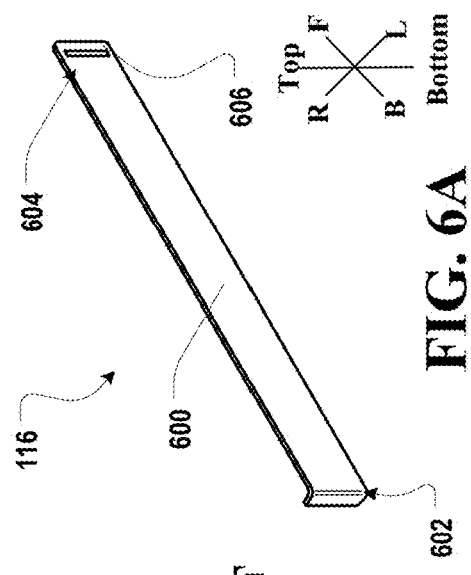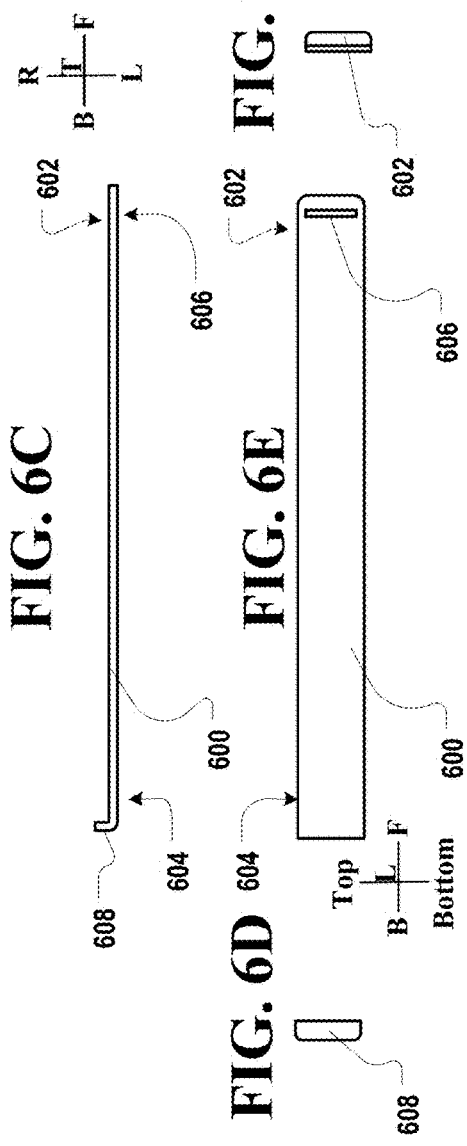

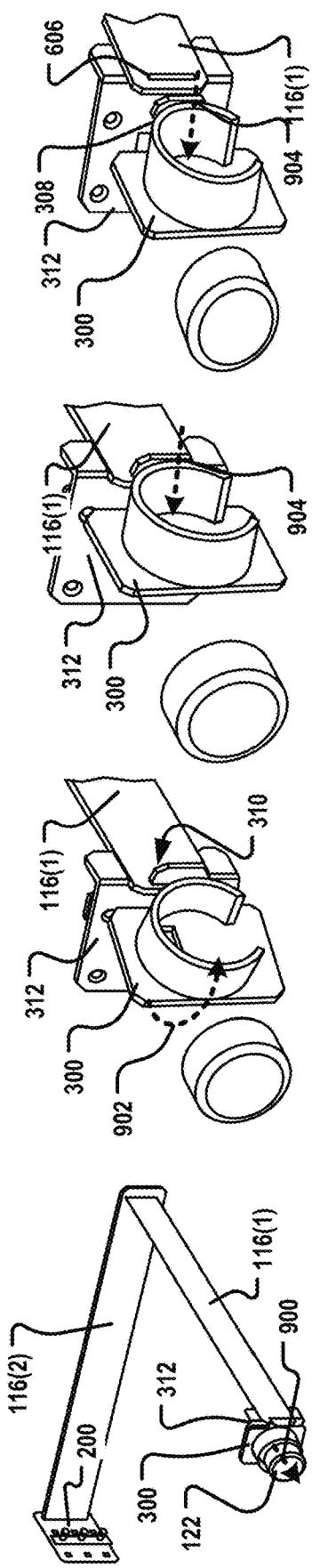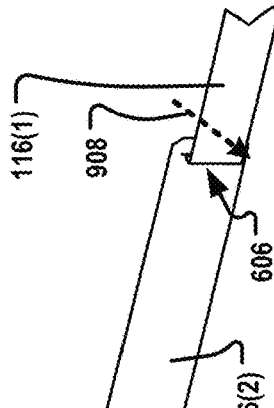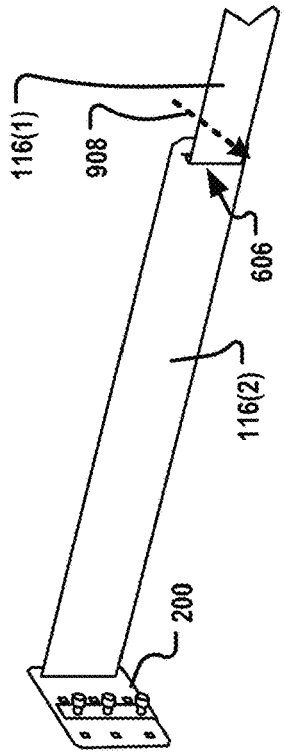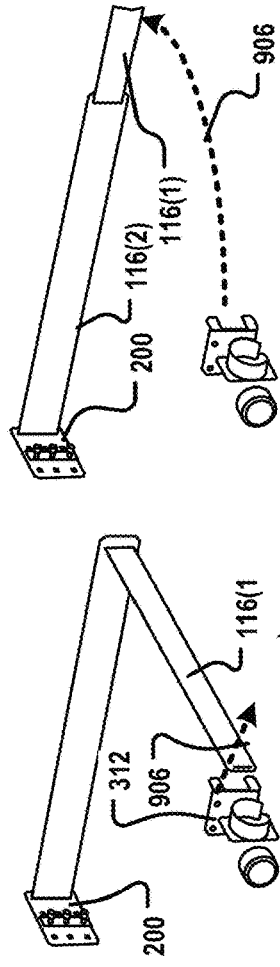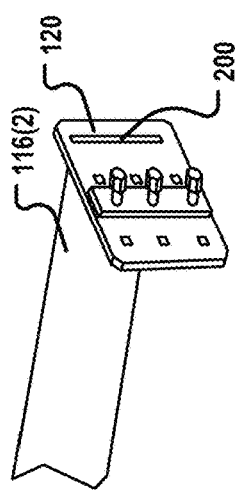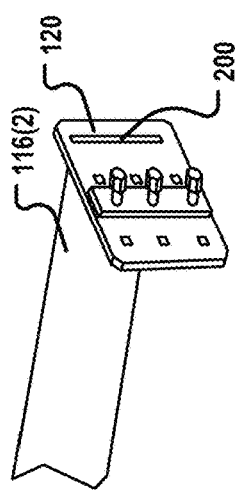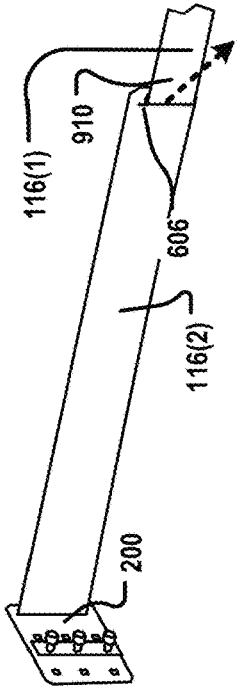

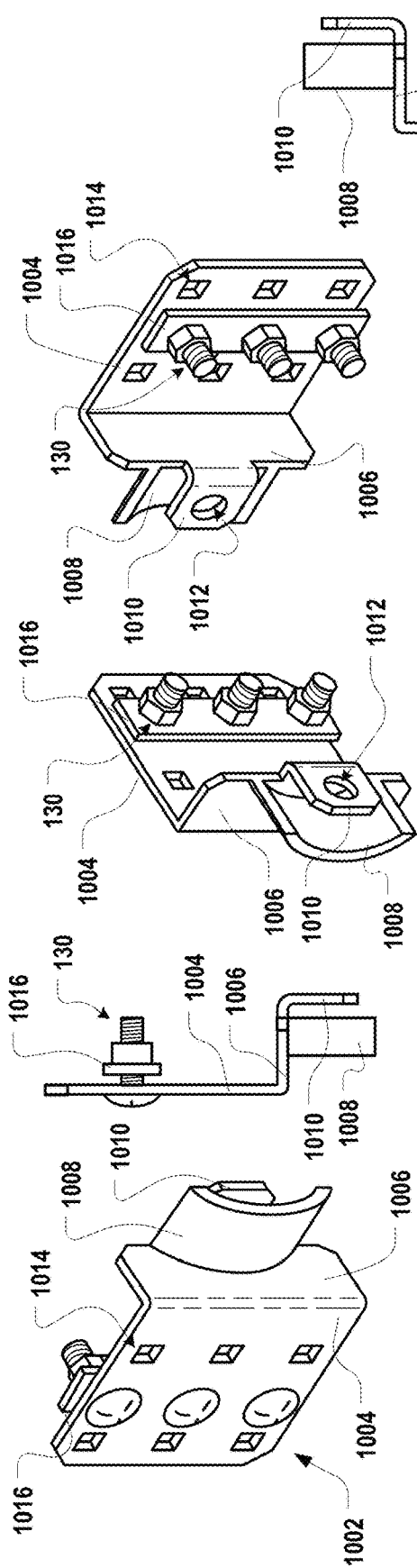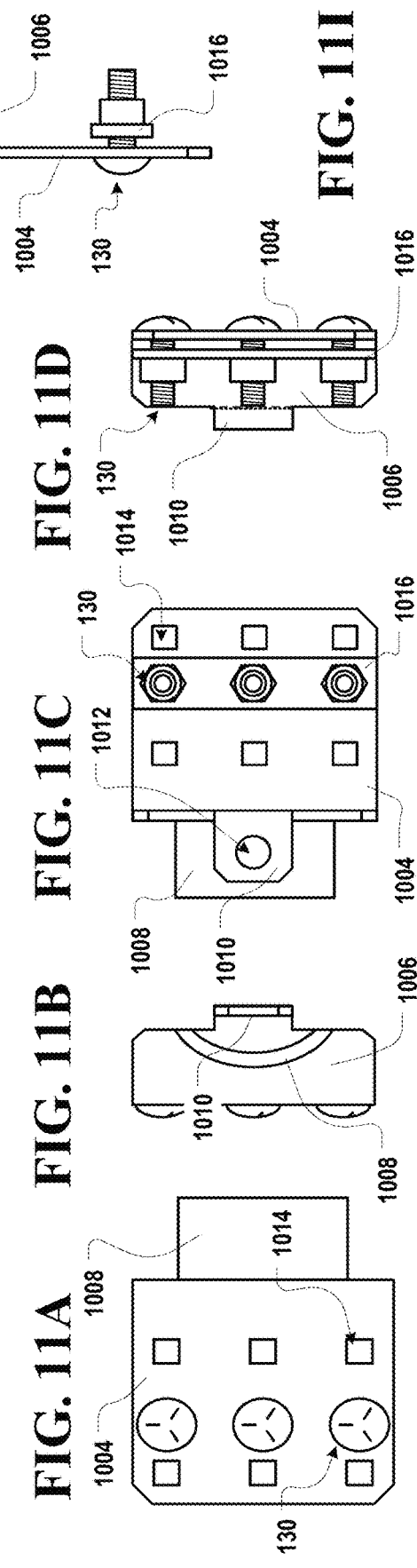

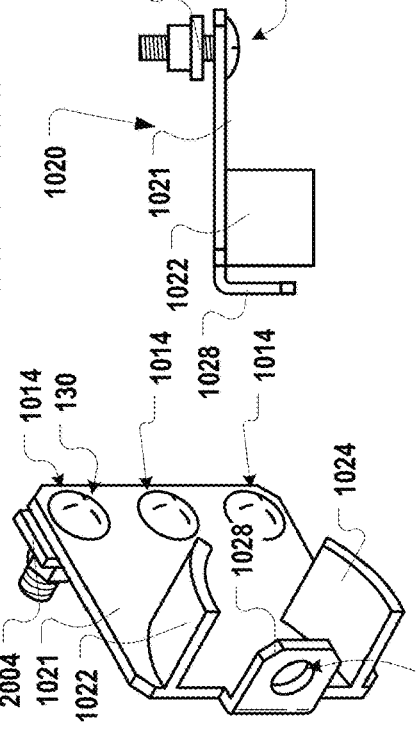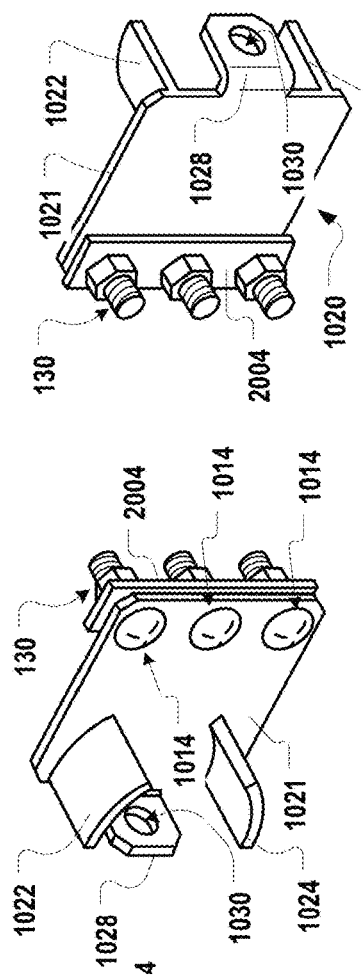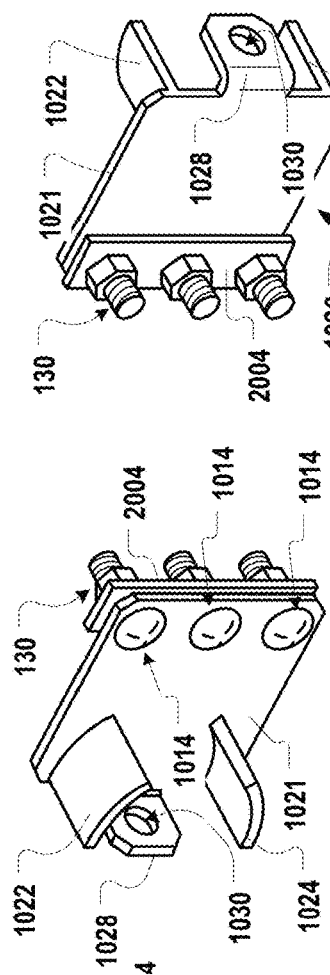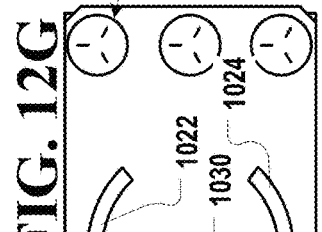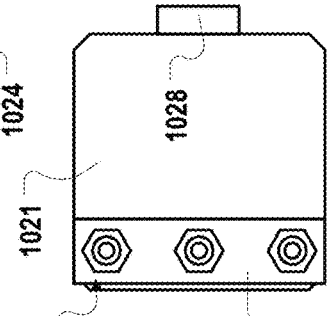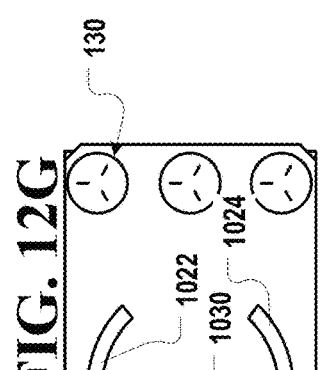

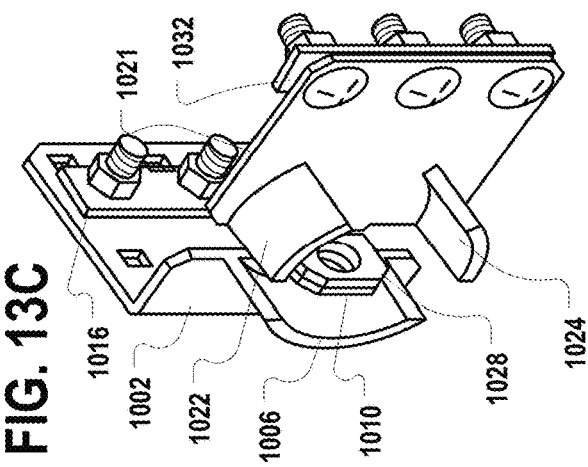
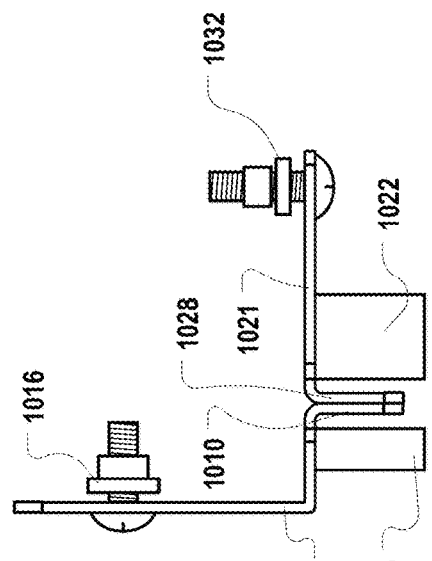
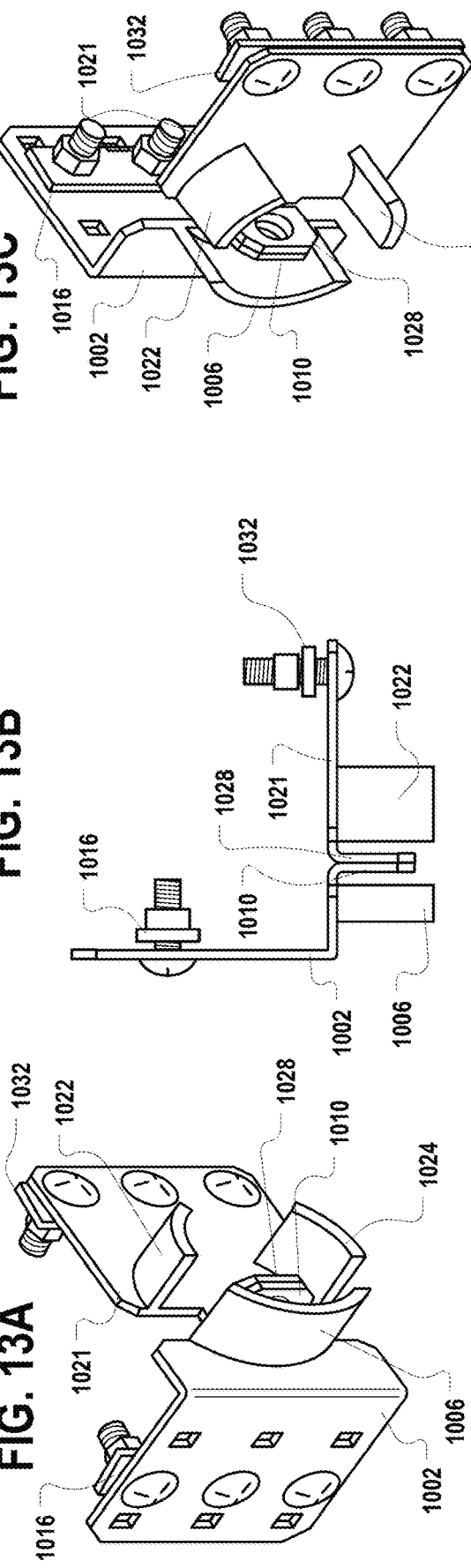
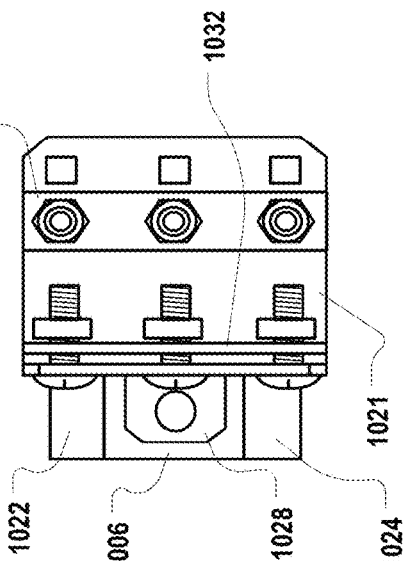
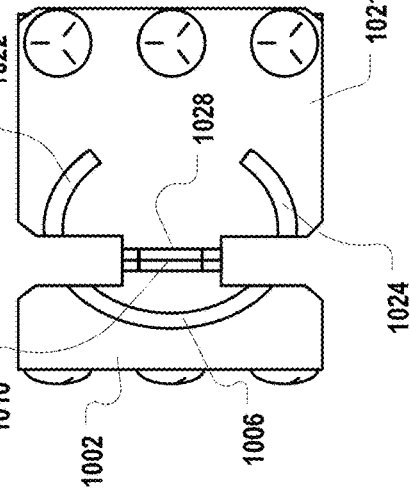
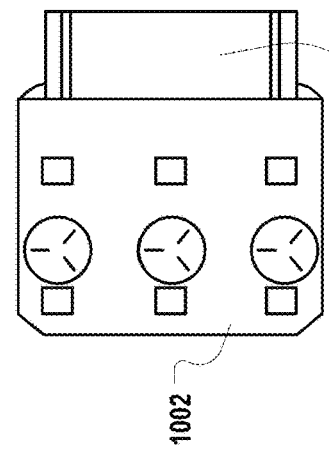

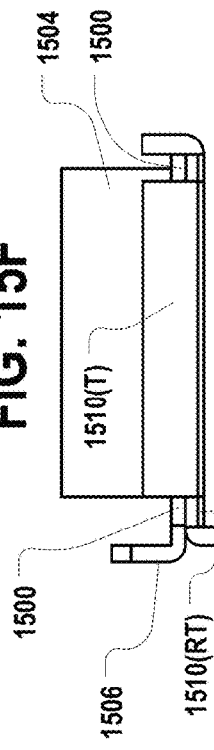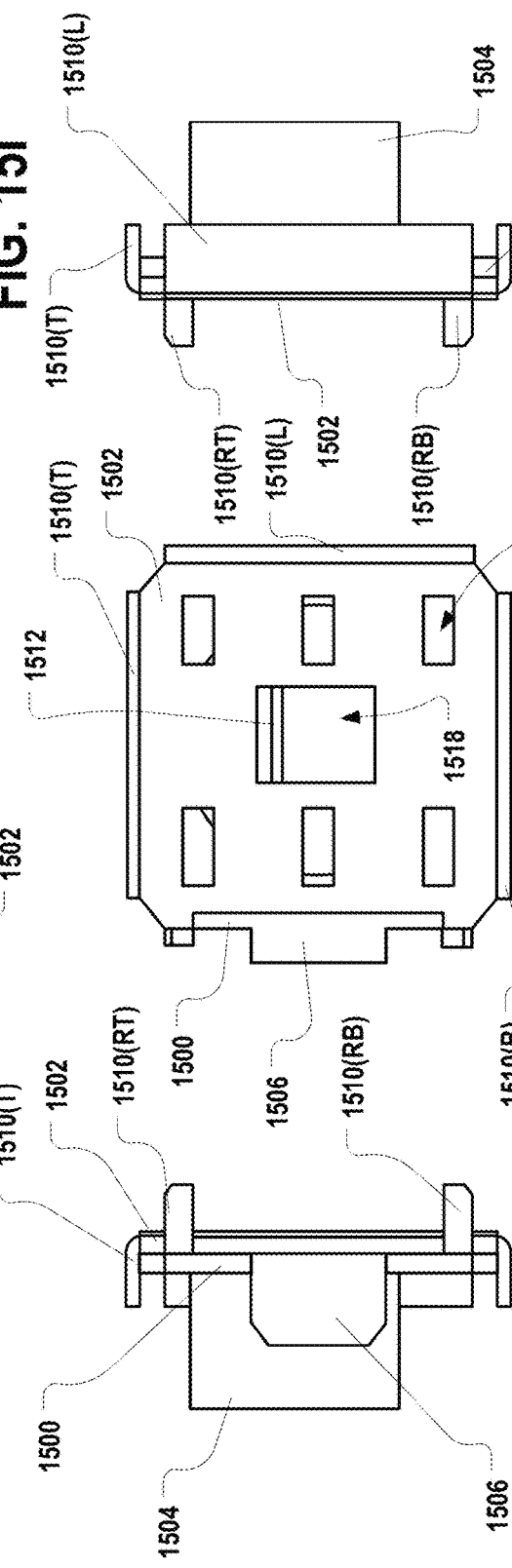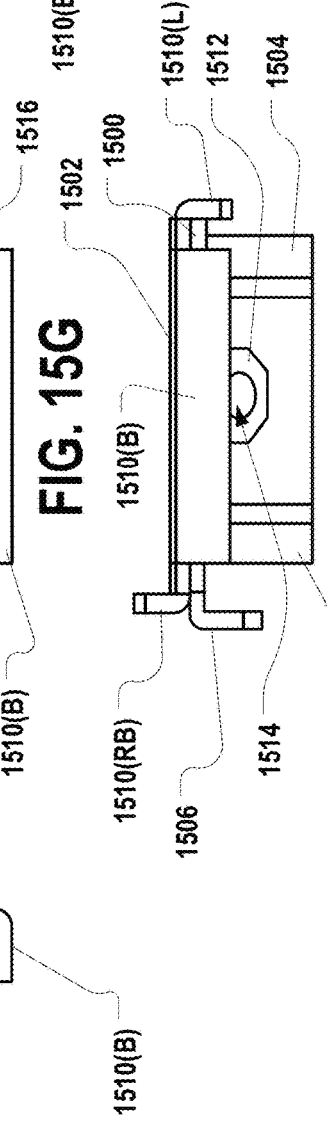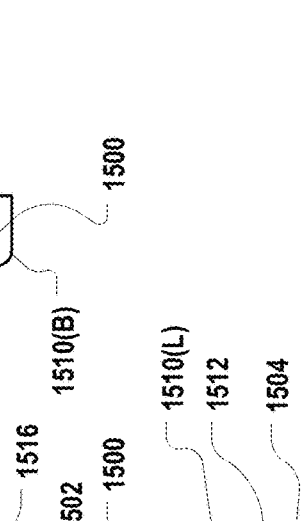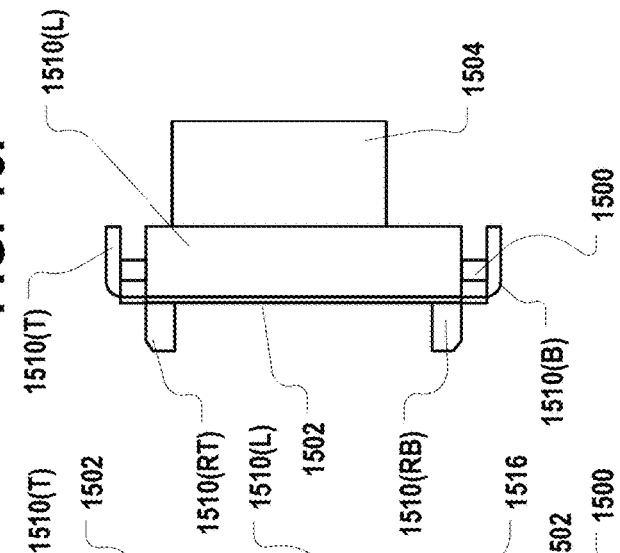

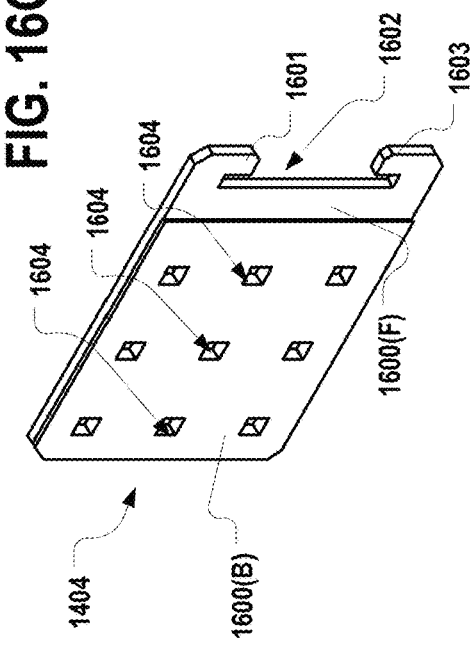
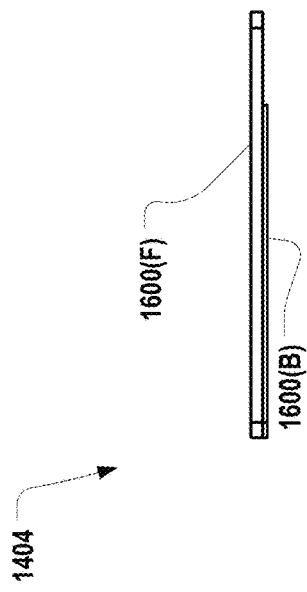
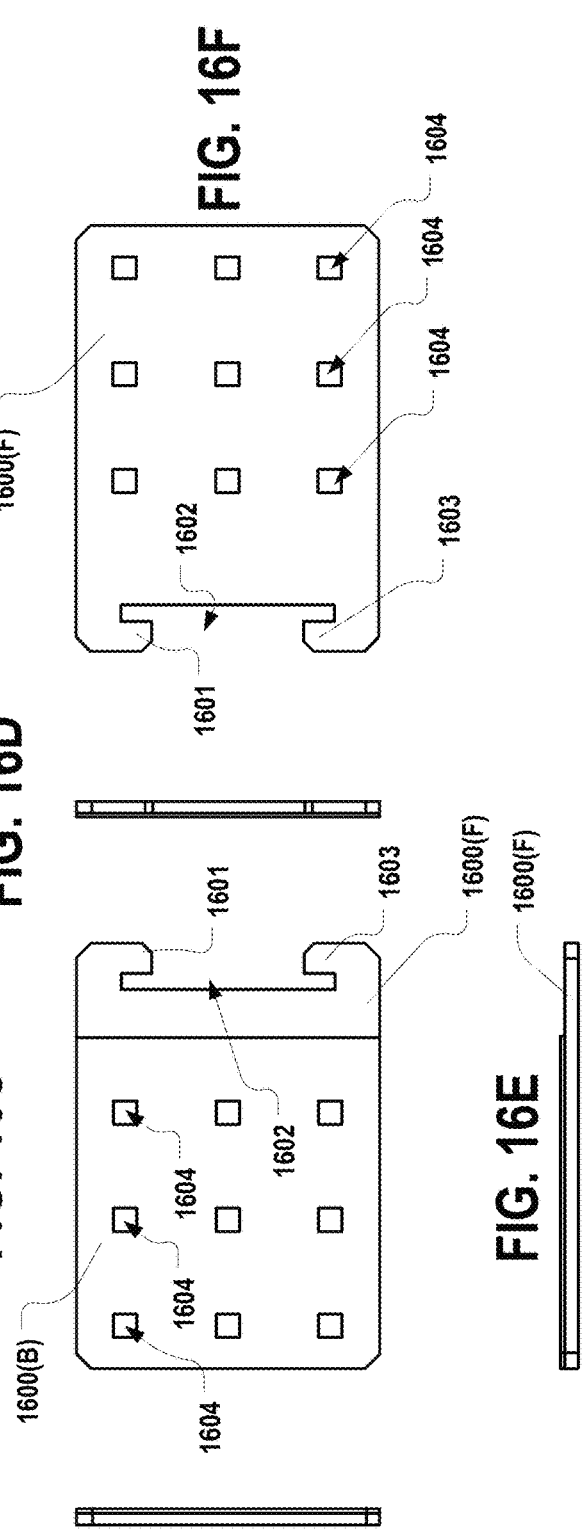
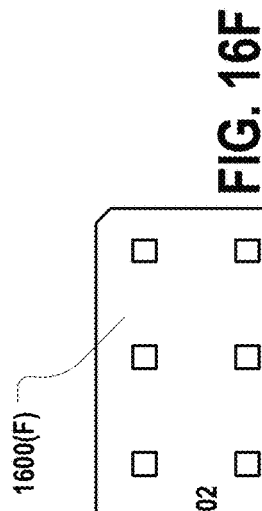
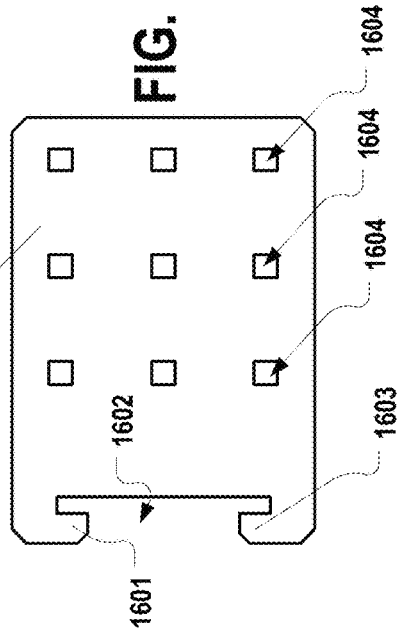

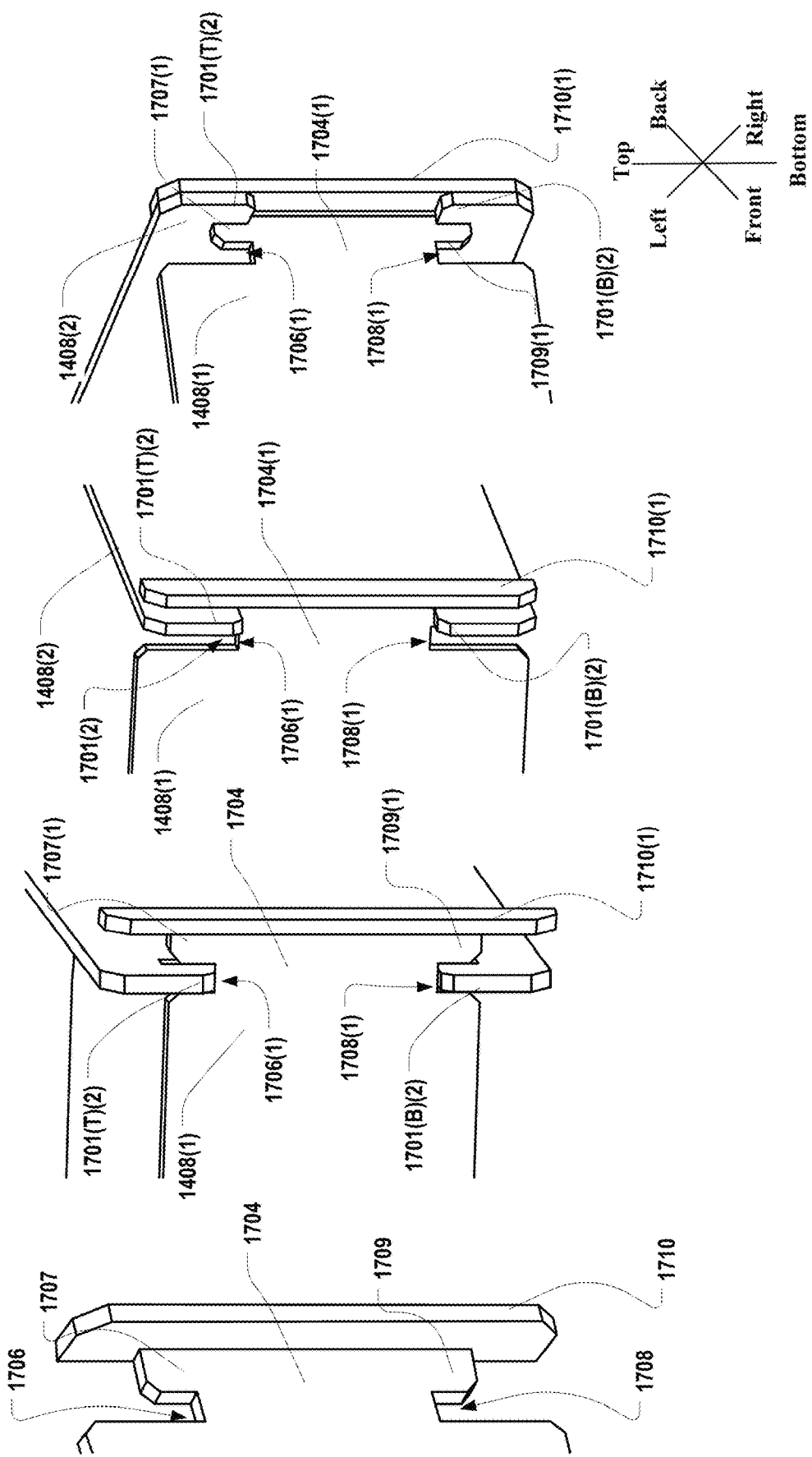

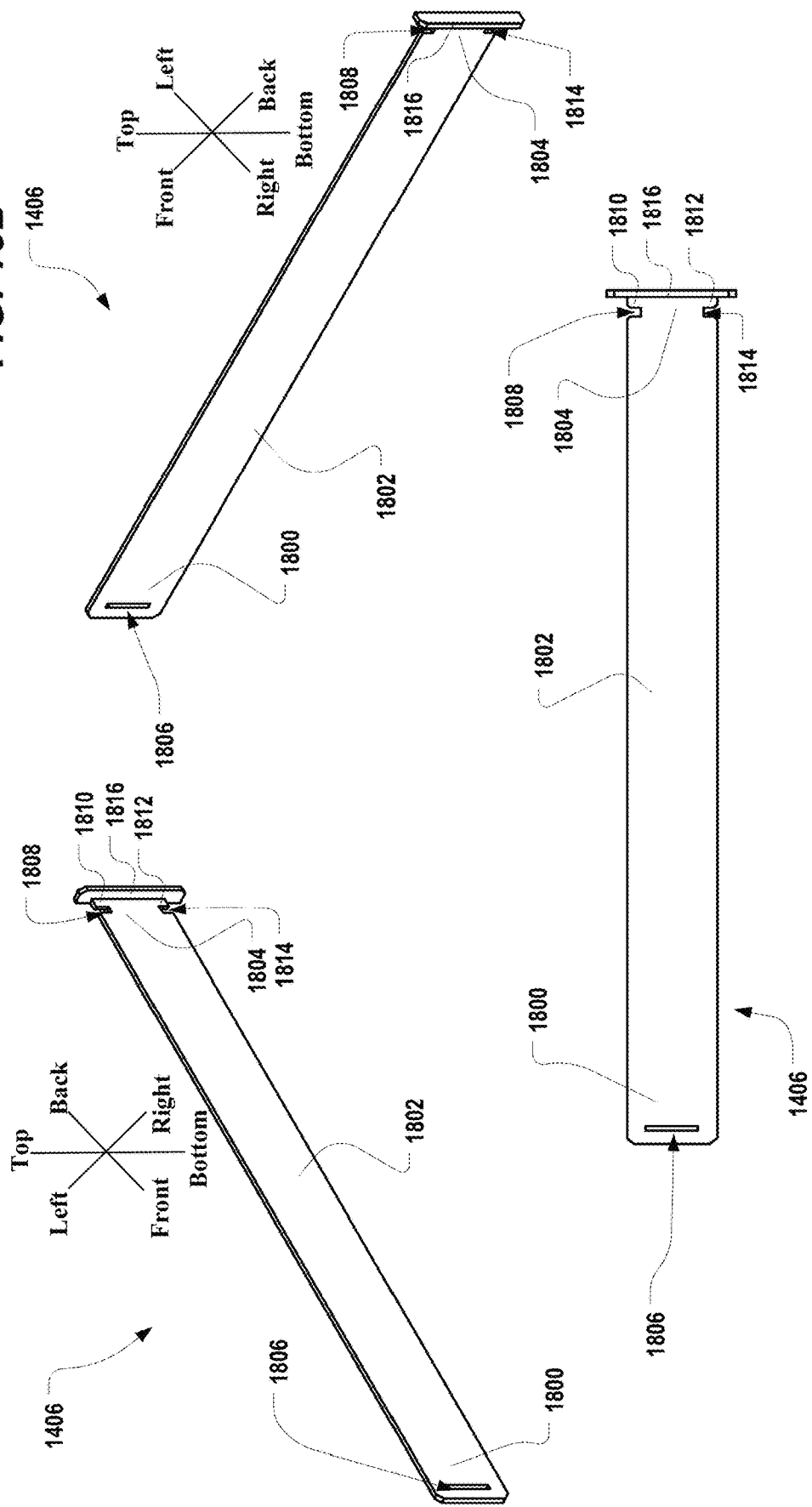

CABINET SECURITY ASSEMBLY

CROSS-REFERENCE TO RELATED APPLICATIONS

This application claims priority to U.S. Provisional Application Ser. No. 63/464,822, filed on 8 May 2023, in the name of inventors Salim Fermin, Terry Thompson, and Charles Iversen, and entitled "Cabinet Security Assembly" (the "'822 Application"), the entire contents of the '822 Application are incorporated herein by reference.

TECHNICAL FIELD

The subject matter described herein relates to devices, systems, and methods for coupling a lock to a structure and securing the structure from unauthorized access to an interior thereof.

BACKGROUND

Various forms of structures such as doors, cabinets, boxes, rooms, containers, or the like are commonly secured using a removable locking mechanism (herein a "padlock"). As used herein, a padlock is a lock that is not physically integrated with a structure, or part thereof, to be secured and is provided separately. One common form of a padlock is a "puck lock." An example of a puck lock and a hasp assembly for use therewith can be found at: Master Lock Puck Lock, Heavy Duty Hidden Shackle Lock and Hasp, Solid Steel Lock for Vans, M736XKAD—Amazon.com.

A padlock, as distinguished from a built-in lock, may be used with multiple different structures, but with one structure at any given time. Non-limiting examples of padlocks include those manufactured under the MASTER LOCK™ brand by Master Lock Company LLC, of Oak Creek, Wisconsin, USA.

A padlock commonly includes a shackle that is secured in a lock body by one or more internal locking members. The locking members typically engage with corresponding notches in the shackle to prevent axial withdrawal of the shackle from the lock body. The internal locking members may be mechanically released by one of several common mechanisms, for example, pin or disk tumblers released by a key or combination locks (e.g., with a single rotating dial or multiple rotating thumbwheels). In some padlock designs, various electronic control mechanisms are used, in addition to the mechanical locking members, to inhibit unauthorized withdrawal of the shackle from the lock body. Non-limiting examples of such electronic control mechanisms include electronic keypads that actuate lock releases and wireless control systems that receive release signals via a communication protocol e.g., Bluetooth® or near field communication (NFC).

A shackle is typically constructed of a hardened metal, a hardened metal alloy, or a composition thereof, such as a boron alloy, hardened steel, or the like. A shackle also commonly may be provided in various lengths, widths, diameters, and materials. Materials may include boron alloys, hardened steel, and the like. Lock bodies are also commonly provided in various lengths, widths, diameters, and materials.

Often a structure includes a latch assembly or similar mechanism configured for use with a padlock to secure the structure. The latch assembly commonly includes a latch eye into which a shackle can be inserted to secure the structure. The latch assembly may commonly be provided in various sizes, with differing eye dimensions, numerous assembly configurations, and the like.

Often a latch assembly may be configured, relative to other structural members of a given structure, such that a limited number of mounting holes are provided. Such mounting holes may not correspond with "open" areas of another structural member of a given structure and thus may require a user to drill into areas of a given structure that may be less rigid, may have insulating elements attached thereto, may have other elements of a given structure, such as electrical wiring or the like, mounted thereto, or otherwise.

Further a given latch assembly may be configured to secure a structural member by being mounted to a door panel and to non-hinged panel of the structure with the door being secured otherwise to the structure by one or more hinges connected to an opposite panel (herein, a "hinged panel") of the structure. An unauthorized person may gain access to the interior of the structure by cutting into and around either a portion of the door or the non-hinged panel for the structure. Accordingly, assemblies, devices and methods of securing interiors of structure, such as electronics cabinets are needed.

SUMMARY

In accordance with at least one implementation of the present disclosure, a first security assembly ("1SA") may be configured in accordance with at least one of the implementation shown in FIGS. 1-8.

In accordance with at least one implementation of the present disclosure, a process for releasing a security device assembly configured in accordance with at least one of the implementation shown in FIGS. 1-8 so as to gain access to an interior of a structure secured by a first security device assembly includes a user performing one or more of the Operations shown in FIGS. 9A-9J and/or as further described herein.

In accordance with at least one implementation of the present disclosure, a second security assembly ("2SA") may be configured in accordance with at least one of the implementation shown in FIGS. 10-13F.

In accordance with at least one implementation of the present disclosure, a third security assembly ("3SA") may be configured in accordance with at least one of the implementation shown in FIGS. 14-20.

In accordance with at least one implementation of the present disclosure, a first system for securing an electronics cabinet may include a fixed bracket assembly (FBA) attached to first panel of an electronics cabinet (EC), a first arm having a proximal portion, a middle portion, and a distal portion, and a lock bracket assembly (LBA) attached to a second panel of the EC. The first arm, when securing the EC, may extend across a third panel of the EC. The third panel may couple the first panel to the second panel of the EC, be attached at the proximal portion to the LBA, and be attached at the distal portion to the FBA. For at least one implementation, the first arm, when attached to both the LBA and the FBA, prevents opening of at least one of the first panel, the second panel, and the third panel of the EC.

For at least one implementation of the first system, the FBA may include an FBA first plate (FBA-FP) that includes a plurality of FBA-FP holes configured to receive a plurality of fasteners, an FBA-FP slot (FBA-FP-S), and an FBA second plate (FBA-SP). The FBA-SP may include a plurality of FBA-SP holes, aligned with one or more of the plurality of FBA-FP holes and configured to receive one or more of the plurality of fasteners. The FBA-FP may be configured for placement on an exterior side of the first panel and the FBA-SP may be configured for placement on an interior side of the first panel. The FBA may be secured to the first panel by extending the plurality of fasteners into the FBA-FP holes, through a corresponding hole in the first panel and into the FBA-SP holes.

For at least one implementation of the first system, the plurality of FBA-FP holes may be aligned in an array of holes including a plurality of horizontal rows and a plurality of vertical columns. The FBA-SP may be configured to align with holes in the array of holes that correspond to one of the vertical columns and two or more of the plurality of horizontal rows.

For at least one implementation of the first system, the distal portion of the arm includes an elbow and the FBA-FP-S may be configured to receive the elbow.

For at least one implementation of the first system, the LBA may include an LBA first lock plate (LBA-1LP), an LBA second lock plate (LBA-2LP), and an LBA backing plate (LBA-BP) having a plurality of holes. For at least one implementation of the first system, the LBA-1LP may include an LBA-1LP lock guard (LBA-1LP-LG), an LBA-ILP hasp slot (LBA-1LP-HS), an LBA-1LP first extending member (LBA-1LP-1E), and an LBA-ILP second extending member (LBA-1LP-2E). The LBA-1LP-1E may extend from the LBA-1LP and may be connected to the LBA-1LP-2E so that LBA-1LP-2E is perpendicular to a planar surface of the LBA-1LP and forms a right angle with the LBA-1LP-1E which may be further configured for insertion into a slot in the first arm.

For at least one implementation of the first system, the LBA-2LP may include a plurality of LBA-2LP holes configured to receive a plurality of fasteners, an LBA-2LP second extending member (LBA-2LP-2E) that extends perpendicularly to the LBA-2LP, and an LBA-2LP hasp (LBA-2LP-H) that includes an LBA-2LP hasp hole (LBA-2LP-HH). The LBA-2LP-H may be configured to accept a lock shackle. The LBA-2LP may be configured for placement on an exterior side of the second panel. The LBA-BP may be configured for placement on an interior side of the second panel. The LBA-2LP may be secured to the second panel by extending the plurality of fasteners into the LBA-2LP holes, through corresponding holes in the second panel and into the LBA-BP holes.

For at least one implementation of the first system, the first arm may include a first arm slot configured to receive the LBA-2LP-2E and a first arm elbow configured for insertion into the FBA-FP-S. The first system may further include a second arm having a proximal portion, a middle portion, and a distal portion and further including a second arm slot configured to receive one of the LBA-2LP-2E and the first arm elbow and a second arm elbow configured for insertion into one of the first arm slot and the FBA-FP-S. The second arm, when securing the EC, may extend across a fourth panel of the EC. The fourth panel may be coupled to two of the first panel, the second panel, and the third panel of the EC. The second arm, when attached to the first arm and one of the LBA and the FBA may prevent opening of at least the fourth panel of the EC.

In accordance with at least one implementation of the present disclosure, a first system for securing an electronics cabinet may include a second security assembly (2SA) first lock bracket (2SA-1 LB) that includes an 2SA-1 LB lock guard (2SA-1 LB-LG), an 2SA-1 LB hasp (2SA-1 LB-H) having a hasp hole (2SA-1 LB-HH) configured to accept a shackle of a lock, and a first plurality of holes configured to each receive a fastener. The 2SA may further include a first backing plate that includes a second plurality of holes configured to each receive a fastener. The fasteners, when inserted into a corresponding combination of the first plurality of holes in the 2SA-1 LB and in the second plurality of holes in the first backing plate, may be configured to secure the 2SA-1 LB to an exterior side of a first panel of an electronics cabinet (EC) and the first backing plate to an interior side of the first panel.

For at least one implementation, the second system may include an 2SA second lock bracket (2SA-2 LB) that includes an 2SA-2 LB lock guard (2SA-2 LB-LG), a 2SA-2 LB hasp (2SA-2 LB-H) having a hasp hole (2SA-1 LB-HH) configured to accept the shackle of the lock, and a third plurality of holes configured to each receive a fastener. The second system may further include a second backing plate that includes a fourth plurality of holes configured to each receive a fastener which, when inserted into the third plurality of holes in the 2SA-2 LB and into the fourth plurality of holes in the second backing plate, may be configured to secure the 2SA-2 LB to an exterior side of a second panel of the EC and the second backing plate to an interior side of the second panel. The first panel and second panel may be perpendicular panels.

For at least one implementation of the second system, the lock is a puck lock.

For at least one implementation of the second system, the 2SA-2 LB-H may include a top lock guard and a bottom lock guard.

For at least one implementation of the second system the 2SA-1 LB-HH and the 2SA-2 LB-HH may be aligned to commonly accept the shackle of the lock when the EC is secured.

In accordance with at least one implementation of the present disclosure, a third system for securing an electronics cabinet may include a fixed bracket assembly (FBA) attached to first side of a first panel of an electronics cabinet (EC), a side arm having a side arm channel portion and a side arm T-head portion, a lock arm having a lock arm slot portion and a lock arm T-head portion, and a lock bracket assembly (LBA) attached to a second side of the first panel of the EC. For at least one implementation of the third system, when the EC is secured, the side arm may extend across a second panel of the EC, may be coupled by the side arm T-head portion to the FBA, and may be coupled by the side arm channel portion to the lock arm. For at least one implementation of the third system, the lock arm may extend across a third panel of the EC, may be coupled at the lock arm slot portion to the LBA, and may be coupled at the lock arm T-head position to the side arm. For at least one implementation of the third system, the first panel, the second panel, and the third panel enclose an interior of the EC. For at least one implementation of the third system, the side arm and the lock arm, when attached respectively to the FBA, each other, and the LBA, may be configured to receive a lock to secure the EC and, when the EC is secured, prevent opening of at least one of the first panel, the second panel, and the third panel of the EC.

For at least one implementation of the third system, the FBA may include an FBA first plate (FBA-FP) that includes a plurality of FBA-FP holes configured to receive a plurality of fasteners and an FBA channel in the FBA channel portion. For at least one implementation of the third system, an FBA backing plate (FBA-BP) may include a plurality of FBA-BP holes, aligned with one or more of the plurality of FBA-FP holes and configured to receive one or more of the plurality of fasteners. The FBA-FP may be configured for placement on an exterior side of the first panel and the FBA-BP may be configured for placement on an interior side of the first panel. For at least one implementation of the third system, the FBA may be secured to the first panel by extending the plurality of fasteners into the FBA-FP holes, through a corresponding hole in the first panel, and into the FBA-BP holes.

For at least one implementation of the third system, the FBA channel may include a channel top extension and a channel bottom extension. The FBA channel may be configured to receive a T-head portion of the side arm.

For at least one implementation of the third system, the side arm T-head portion may include a top recess, a top extension, coupled to the top recess, a bottom recess, a bottom extension coupled to the bottom recess, and a ridge. The top recess and the bottom recess may be configured to facilitate insertion of the side arm into the FB channel. The top extension and the bottom extension may be configured to inhibit removal of the side arm from the FB channel. For at least one implementation of the third system, removal of the side arm from the FB channel may be inhibited when the side arm is slid into the FB channel such that the ridge contacts a surface of the FB.

For at least one implementation of the third system, the LBA may include an LBA first plate (LBA-FP) that includes an elbow configured for insertion into the lock arm slot portion of the lock arm when the EC is secured. The LBA may further include a hasp opening and a lock guard. The third system may further include an LBA second plate (LBA-SP) that includes a plurality of LBA-FP holes configured to receive a plurality of fasteners, and a hasp having a hasp hole configured to receive a shackle of lock. When a hasp extends through the hasp opening, the EC may be secured by the lock. The third system may further include an LBA backing plate (LBA-BP) that may include a plurality of LBA-BP holes, aligned with one or more of the plurality of LBA-SP holes and configured to receive one or more of the plurality of fasteners. The LBA-SP may be configured for placement on an exterior side of the first panel. The LBA-BP may be configured for placement on an interior side of the first panel. The LBA-SP may be secured to the LBA-BP by extending the plurality of fasteners into the LBA-SP holes, through a corresponding hole in the first panel, and into the LBA-BP holes.

For at least one implementation of the third system, the LBA-SP may include a plurality of extensions configured to hold the LBA-FP.

For at least one implementation of the third system, the lock arm T-head portion may include a top recess, a top extension, coupled to the top recess, a bottom recess, a bottom extension coupled to the bottom recess, and a ridge. The top recess and the bottom recess may be configured to facilitate insertion of the lock arm into the side arm channel portion. The top extension and the bottom extension may be configured to inhibit removal of the lock arm from the side arm channel portion. Removal of the lock arm from the side arm channel portion may be inhibited when the lock arm is slid into the side arm channel portion such that the ridge contacts a surface of the side arm channel portion.

BRIEF DESCRIPTION OF THE DRAWINGS

The features, aspects, advantages, functions, modules, and components of the devices, systems and processes provided by the various implementations of implementations of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When the first reference label is used in the specification, the description is applicable to any of the similar components and/or views having the same first reference number irrespective of any additional alphabetic designators or second reference labels, if any.

The use of cross-hatching, if any, in the accompanying figures is generally provided to indicate a surface of a cross-section cut. The use of contour lines, shading, or stippling in the accompanying figures is generally provided indicate surface features, including curved surfaces or changes in depth, to clarify boundaries between adjacent elements, and to facilitate legibility of the figures. Accordingly, neither the presence nor the absence of cross-hatching, contour lines, shading, or stippling conveys or indicates any preference or requirement for particular materials, material properties, element proportions, element dimensions, commonalities of similarly illustrated elements, or any other characteristic, attribute, or property for any element illustrated in the accompanying figures.

Additionally, the proportions and dimensions (either relative or absolute) of the various features and elements (and collections and groupings thereof) and the boundaries, separations, and positional relationships presented therebetween, are provided in the accompanying figures merely to facilitate an understanding of the various non-limiting implementations described herein and, accordingly, may not be presented or illustrated to scale, and do not indicate any preference or requirement for an illustrated implementation to the exclusion of other implementations described with reference thereto.

Figure 1A:
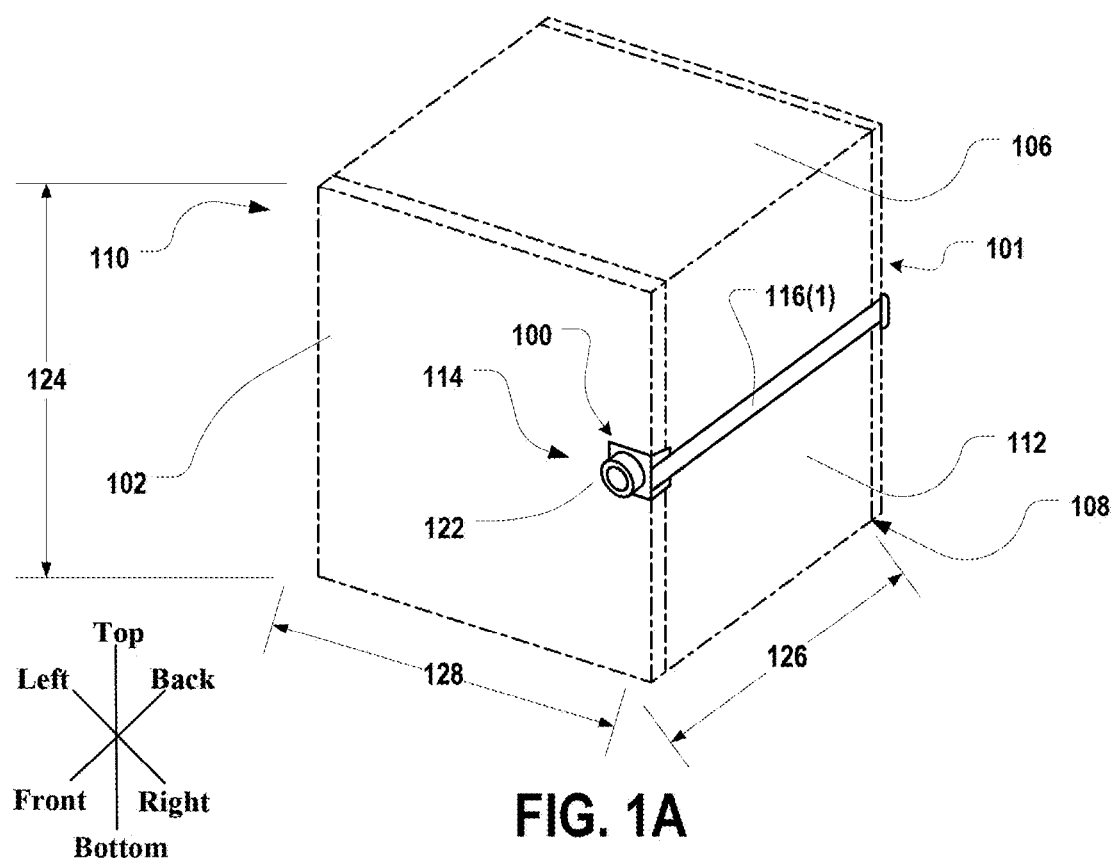

FIG. 1A is an isometric view of an 1SA securing a structure, such as an electronics cabinet ("EC"), as viewed from a "front-right" perspective, as defined in view of the Top (T), Bottom, Left (L), Right (R), Front (F), and Back (B) coordinate system shown in FIG. 1A (herein the "first coordinate system"), and in accordance with at least one implementation of the present disclosure.

Figure 1B:
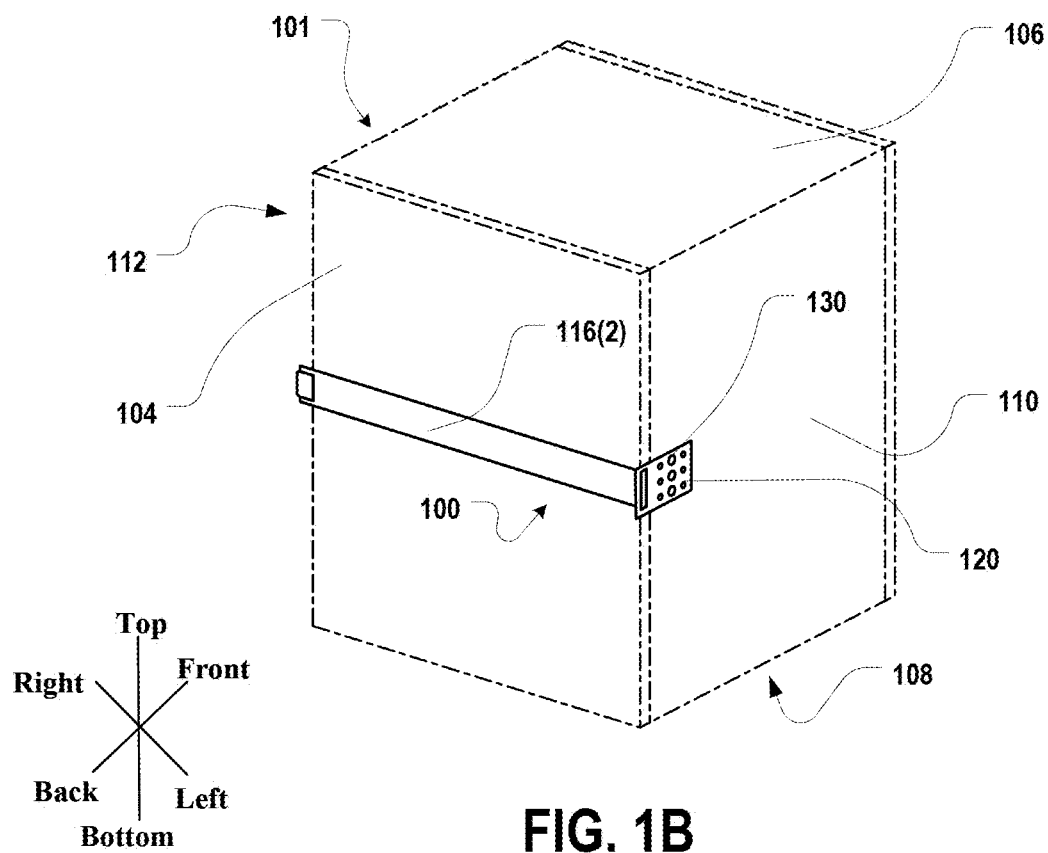

FIG. 1B is a rear-back isometric view of the 1SA of FIGS. 1A and 1n accordance with at least one implementation of the present disclosure.

Figure 2A:
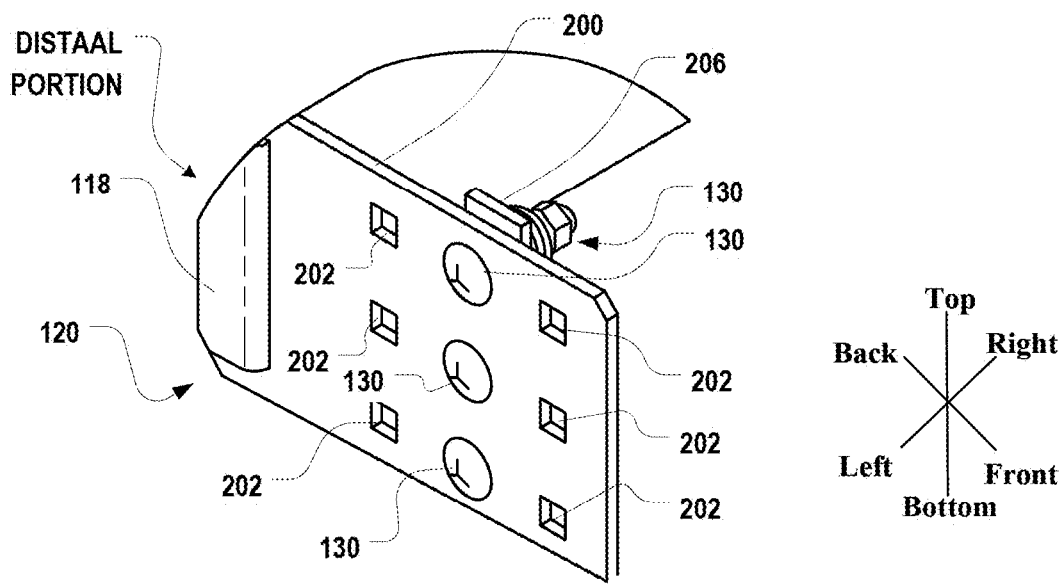

FIG. 2A is an isometric view of a first security assembly fixed bracket assembly ("1SA-FBA") for the 1SA illustrated in FIG. 1A, as viewed from a left-front direction and in accordance with at least one implementation of the present disclosure.

Figure 2B:
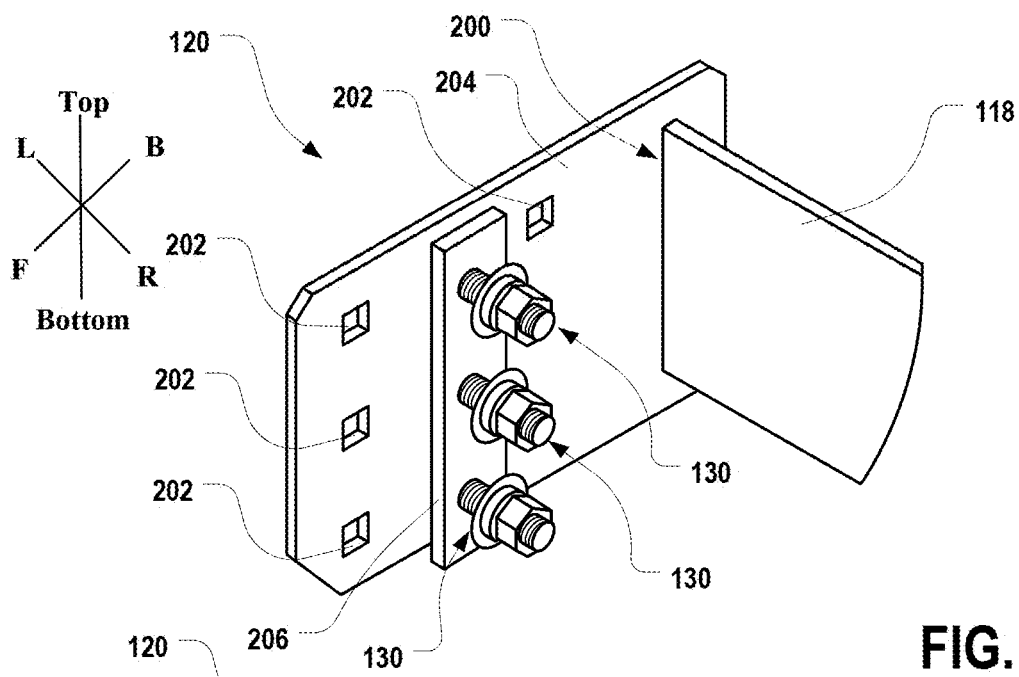

FIG. 2B is an isometric view of the 1SA-FBA of FIG. 2A, as viewed from a right-back direction and in accordance with at least one implementation of the present disclosure.

FIG. 2C is an isometric view of the 1SA-FBA of FIG. 2A, as viewed from a left-back direction and in accordance with at least one implementation of the present disclosure.

FIG. 2D is a planar view of the 1SA-FBA of FIG. 2A, as viewed from a top direction and in accordance with at least one implementation of the present disclosure.

FIG. 2E is an isometric view of the 1SA-FBA of FIG. 2A, as viewed from a left-front direction and in accordance with at least one implementation of the present disclosure.

FIG. 2F is an isometric view of the 1SA-FBA of FIG. 2A, as viewed from a back-right direction and in accordance with at least one implementation of the present disclosure.

FIG. 2G is a planar view of the 1SA-FBA of FIG. 2A, as viewed from a back direction and in accordance with at least one implementation of the present disclosure.

FIG. 2H is a planar view of the 1SA-FBA of FIG. 2A, as viewed from the left direction and in accordance with at least one implementation of the present disclosure.

FIG. 2I is a planar view of the 1SA-FBA of FIG. 2A, as viewed from a front direction and in accordance with at least one implementation of the present disclosure.

FIG. 2J is a planar view of the 1SA-FBA of FIG. 2A, as viewed from a right direction and in accordance with at least one implementation of the present disclosure.

FIG. 2K is a planar view of the 1SA-FBA of FIG. 2A, as viewed from a bottom direction and in accordance with at least one implementation of the present disclosure.

Figure 2L:
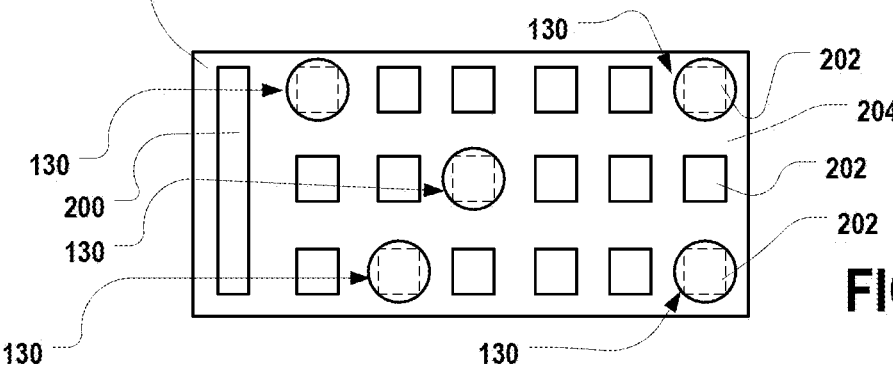

FIG. 2L is a view of the 1SA-FBA of FIG. 2A, as viewed from a left perspective and depicting mounting hardware variously distributed across the 1SA-FBA.

Figure 3A:
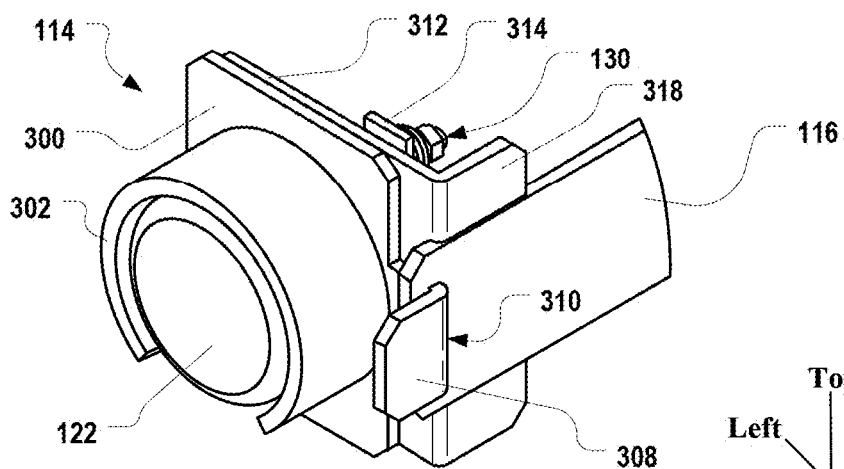

FIG. 3A is a front-right isometric view of a first security assembly lock bracket assembly ("1SA-LBA") for the 1SA of FIG. 1A, wherein the 1SA-LBA is in a closed or secured configuration, and in accordance with at least one implementation of the present disclosure.

Figure 3B:
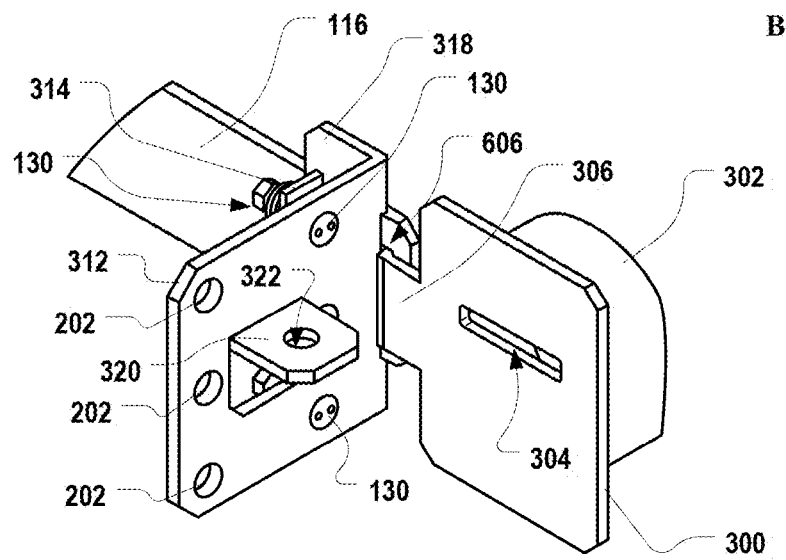

FIG. 3B is a front-left isometric view of the 1SA-LBA of FIG. 1A, wherein the 1SA-LBA is an open or unsecured secured configuration, and in accordance with at least one implementation of the present disclosure.

Figure 3C:
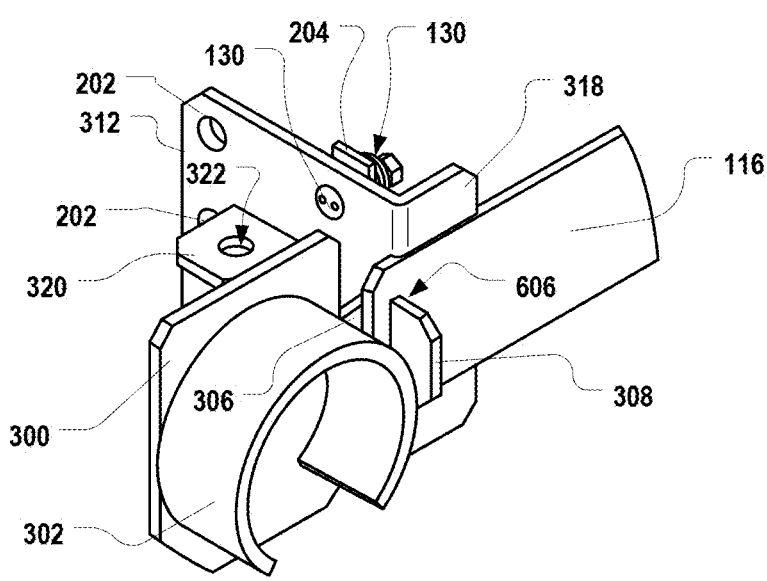

FIG. 3C is a front-left isometric view of the 1SA-LBA of FIG. 1A, wherein the 1SA-LBA is an open or unsecured secured configuration, and in accordance with at least one implementation of the present disclosure.

FIG. 4A is a front-left isometric view of a first security assembly lock backet assembly first lock bracket ("1SA-LBA-1 LB") of the 1SAFBA of FIGS. 3A-3C.

FIG. 4B is a top view of the 1SA-LBA-1 LB of FIG. 4A.

FIG. 4C is a front-right isometric view of the 1SA-LBA-1 LB of FIG. 4A.

FIG. 4D is a back isometric view of the 1SA-LBA-1 LB of FIG. 4A.

FIG. 4E is a left side view of the 1SA-LBA-1 LB of FIG. 4A.

FIG. 4F is a front view of the 1SA-LBA-1 LB of FIG. 4A.

FIG. 4G is a right side view of the 1SA-LBA-1 LB of FIG. 4A.

FIG. 4H is a back view of the 1SA-LBA-1 LB of FIG. 4A.

FIG. 4I is a bottom view of the 1SA-LBA-1 LB of FIG. 4A.

FIG. 5A is a front-left isometric view of a first security assembly lock backet assembly second lock bracket ("1SA-LBA-2 LB") of the 1SA-LBA of FIGS. 3A-3C and of the 1SA of FIG. 1A and in accordance with at least one implementation of the present disclosure.

FIG. 5B is a top view of the 1SA-LBA-2 LB of FIG. 5A.

FIG. 5C is a front-right isometric view of the 1SA-LBA-2 LB of FIG. 5A.

FIG. 5D is a back isometric view of the 1SA-LA-2 LB of FIG. 5A.

FIG. 5E is a left side view of the 1SA-FBA-2 LB of FIG. 5A.

FIG. 5F is a front view of the 1SA-FBA-2 LB of FIG. 5A.

FIG. 5G is a right side view of the 1SA-LBA-2 LB of FIG. 5A.

FIG. 5H is a back view of the 1SA-LBA-2 LB of FIG. 5A.

FIG. 5I is a bottom view of the 1SA-LBA-2 LB of FIG. 5A.

FIG. 6A is a back isometric view, of a first security assembly arm ("1SA-Arm") of FIG. 1A, and in accordance with at least one implementation of the present disclosure.

FIG. 6B is a front isometric view of the 1SA-Arm of FIG. 6A.

FIG. 6C is a top view of the 1SA-Arm of FIG. 6A.

FIG. 6D is a back view of the 1SA-Arm of FIG. 6A.

FIG. 6E is a left view of the 1SA-Arm of FIG. 6A.

FIG. 6F is a front view of the 1SA-Arm of FIG. 6A.

FIG. 6G is a bottom view of the 1SA-Arm of FIG. 6A.

FIG. 6H is a right view of the 1SA-Arm of FIG. 6A.

Figure 7:
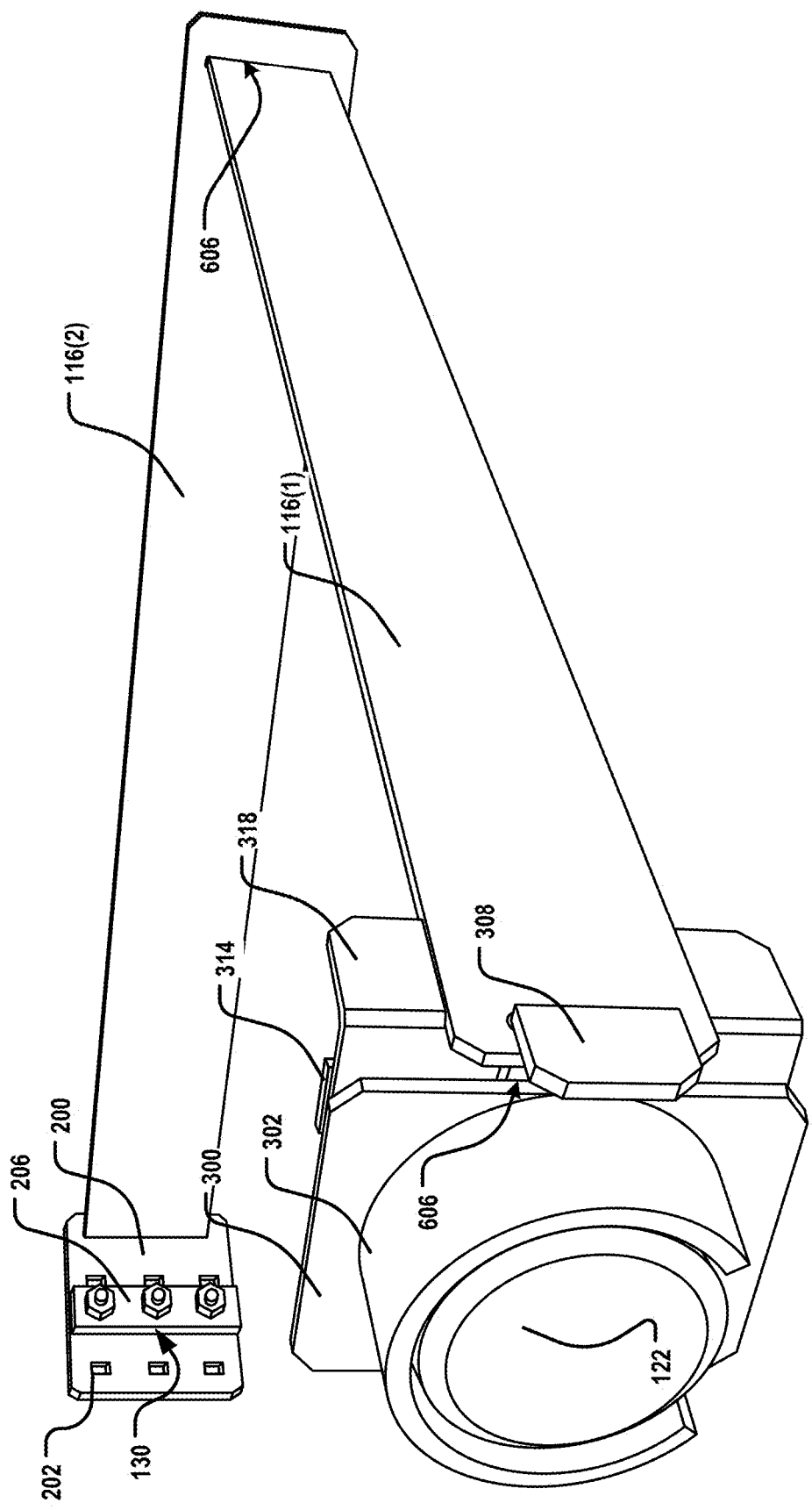

FIG. 7 is a front right isometric view, as viewed in relation to the first coordinate system, of the 1SA of FIG. 1A, as fully assembled and in a closed or secured configuration, about a non-shown electronics cabinet, and in accordance with at least one implementation of the present disclosure.

Figure 8:
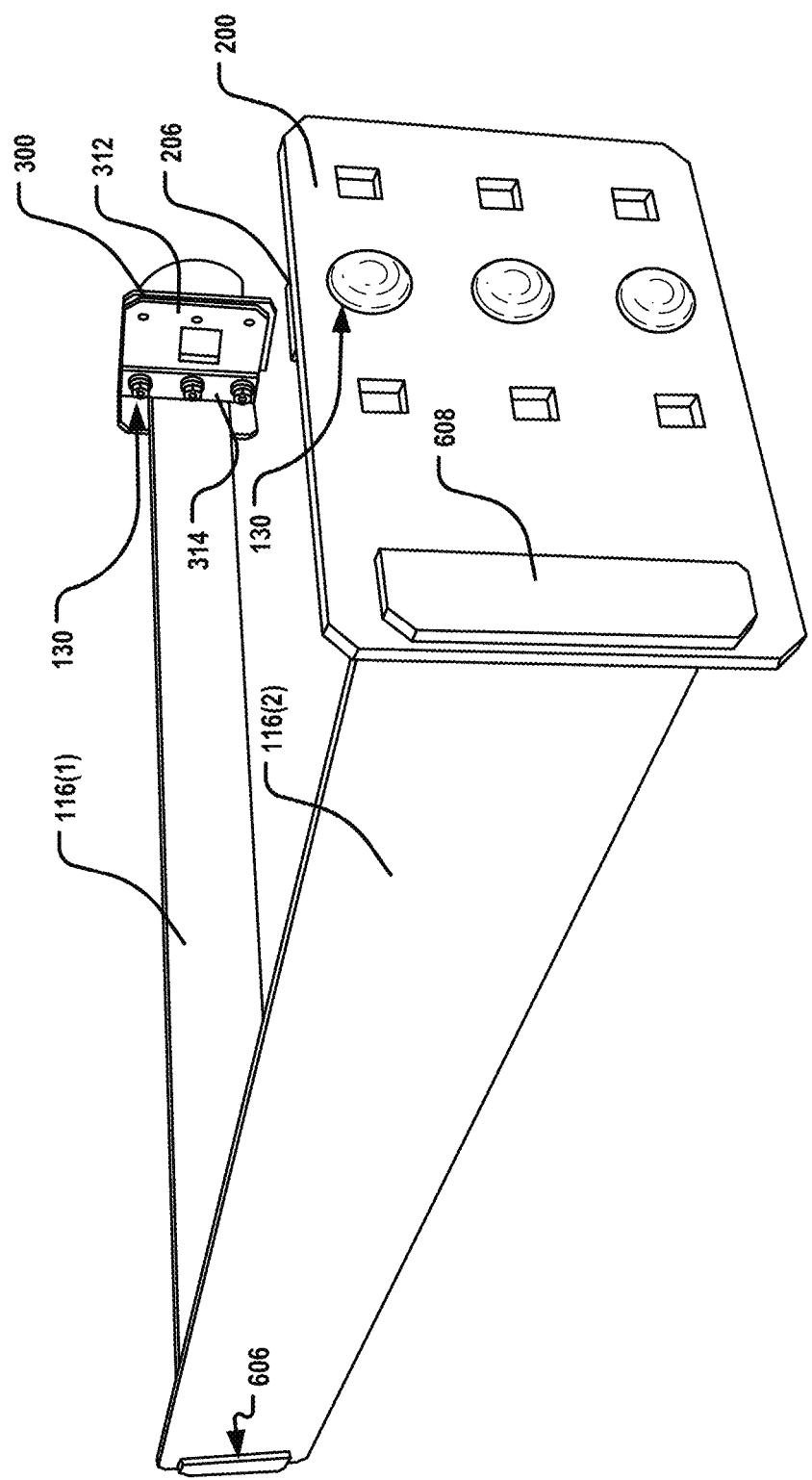

FIG. 8 is a back-left isometric view, as viewed in relation to the first coordinate system, of the 1SA of FIG. 1A, as fully assembled and in a closed or secured configuration, about a non-shown electronics cabinet, and in accordance with at least one implementation of the present disclosure.

FIGS. 9A-9J illustrate configurations of the 1SA of FIG. 1A, after various operations, have been performed when an 1SA surrounding an electronics cabinet, with the operations beginning in FIG. 9A with the 1SA in a closed/secured configuration and ending in FIG. 9J with the 1SA in an open/unsecured configuration, and in accordance with at least one implementation of the present disclosure.

Figure 10:
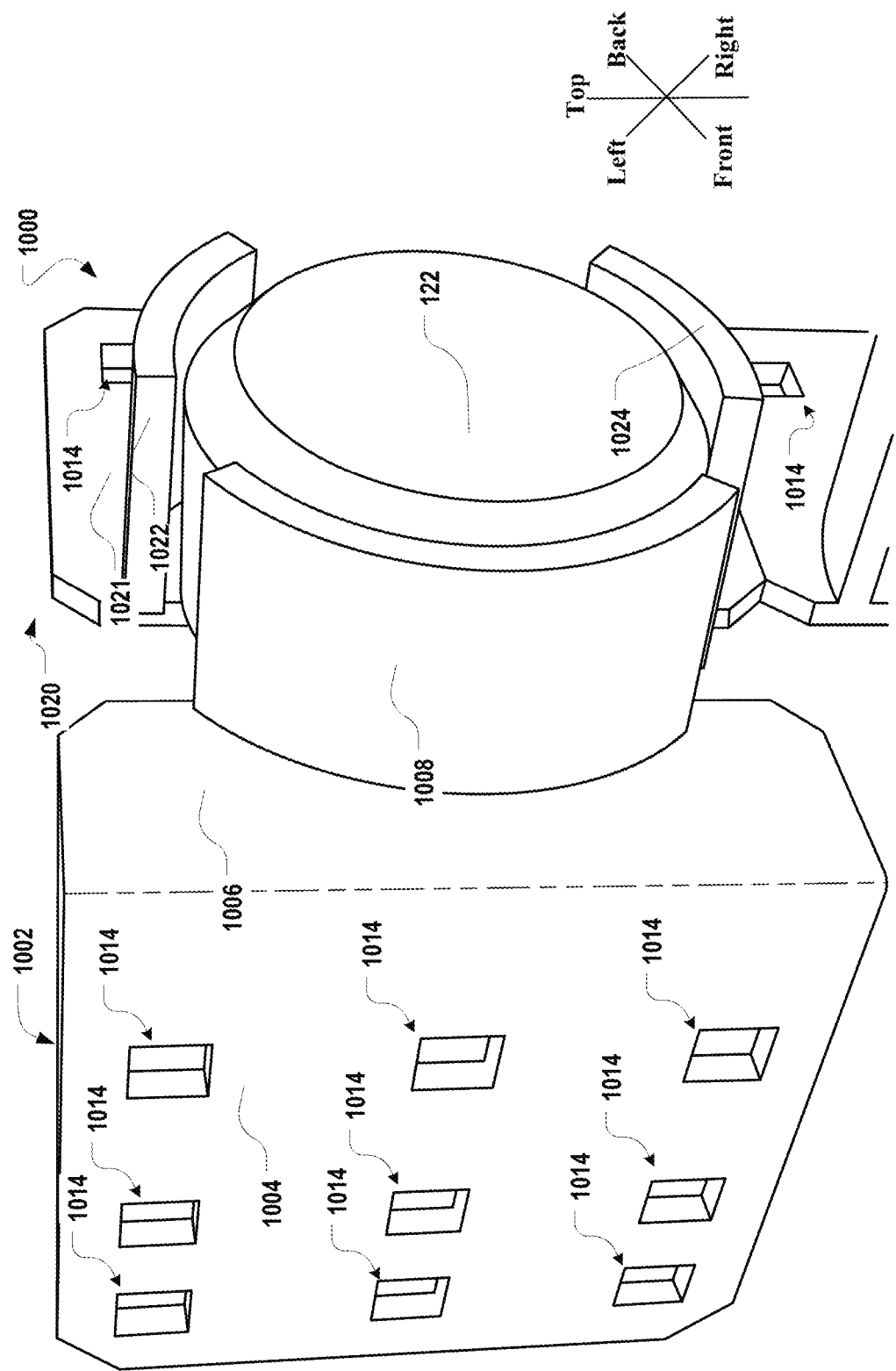

FIG. 10 is an isometric view of a second security assembly ("2SA") securing a structure, such as an EC, as viewed in relation to the first coordinate system, and in accordance with at least one implementation of the present disclosure.

FIG. 11A is a right-front isometric view of a second security assembly first lock bracket (herein, a "2SA-1 LB") and in accordance with at least one implementation of the present disclosure.

FIG. 11B is a top plane view of the 2SA-1 LB of FIG. 11A.

FIG. 11C is a back-right isometric view of the 2SA-1 LB of FIG. 11A.

FIG. 11D is a back-left isometric view of the 2SA-1 LB of FIG. 11A.

FIG. 11E is a front plane view of the 2SA-1 LB of FIG. 11A.

FIG. 11F is a right plane view of the 2SA-1 LB of FIG. 11A.

FIG. 11G is a back plane view of the 2SA-1 LB of FIG. 11A.

FIG. 11H is a left plane view of the 2SA-1 LB of FIG. 11A.

FIG. 11I is a bottom plane view of the 2SA-1 LB of FIG. 11A.

FIG. 12A is a right-front isometric view of a second security assembly second lock bracket ("2SA-2 LB") and in accordance with at least one implementation of the present disclosure.

FIG. 12B is a top plane view of the 2SA-2 LB of FIG. 12A.

FIG. 12C is a right-back isometric view of the 2SA-2 LB of FIG. 12A.

FIG. 12D is a left-back isometric view of the 2SA-2 LB of FIG. 12A.

FIG. 12E is a front plane view of the 2SA-2 LB of FIG. 12A.

FIG. 12F is a top plane view of the 2SA-2 LB of FIG. 12A.

FIG. 12G is a right plane view of the 2SA-2 LB of FIG. 12A.

FIG. 12H is a back plane view of the 2SA-2 LB of FIG. 12A.

FIG. 12I is a left plane view of the 2SA-2 LB of FIG. 12A.

FIG. 13A is a front-right isometric view of the 2SA of FIG. 10, further showing the 2SA-1 LB of FIGS. 11A-11I aligned with the 2SA-2 LB of FIGS. 12A-12I for attachment of a lock thereto, and in accordance with at least one implementation of the present disclosure.

FIG. 13B is a top plane view of the 2SA of FIG. 13A.

FIG. 13C is a right-back isometric view of the 2SA of FIG. 13A.

FIG. 13D is a front plane view of the 2SA of FIG. 13A.

FIG. 13E is a right plane view of the 2SA of FIG. 13A.

FIG. 13F is a back plane view of the 2SA of FIG. 13A.

Figure 14A:
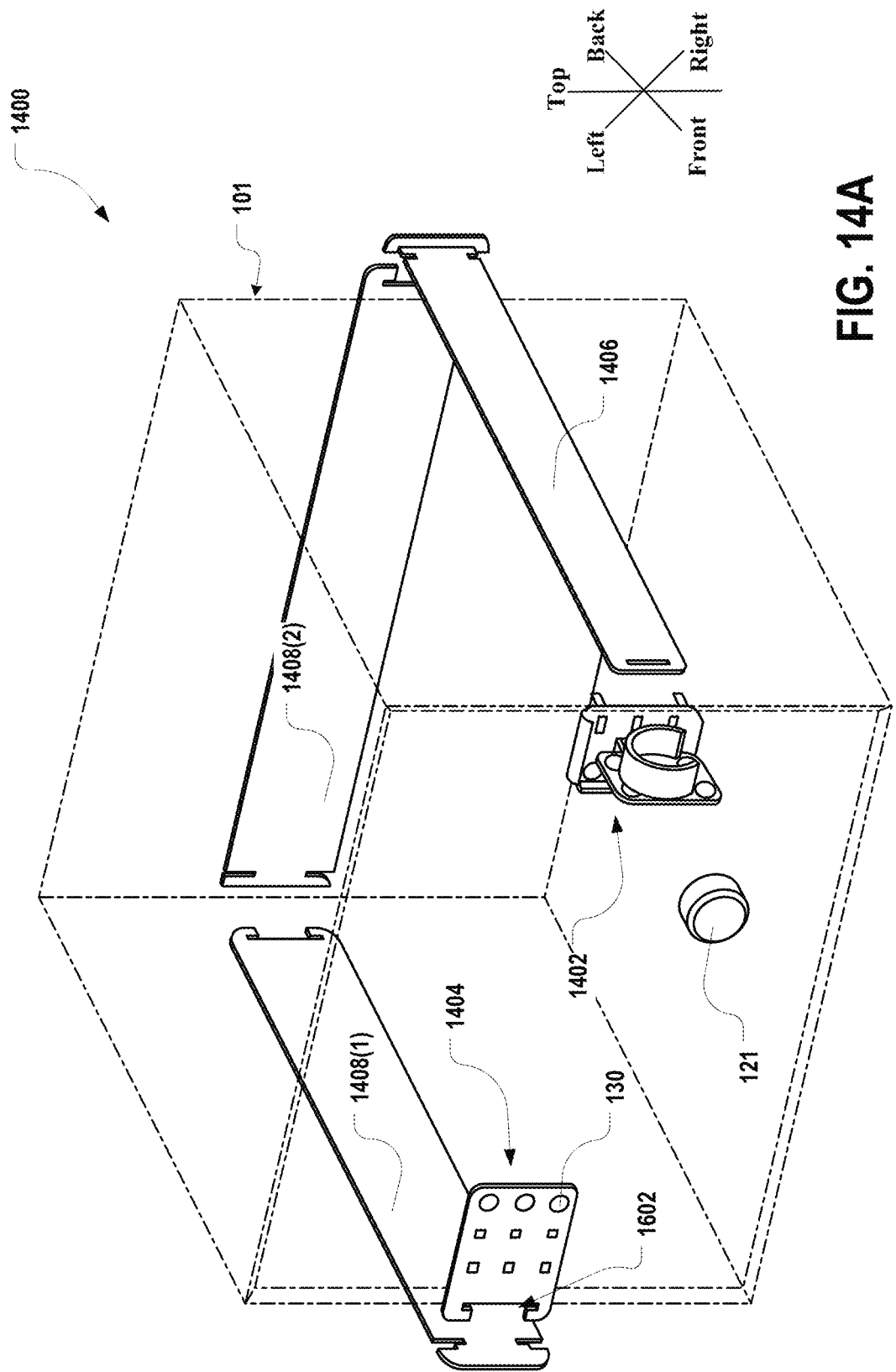

FIG. 14A is an isometric view of a third security assembly ("3SA") securing a structure, such as an EC, as viewed in relation to the first coordinate system, and in accordance with at least one implementation of the present disclosure.

Figures 14B, 14C:
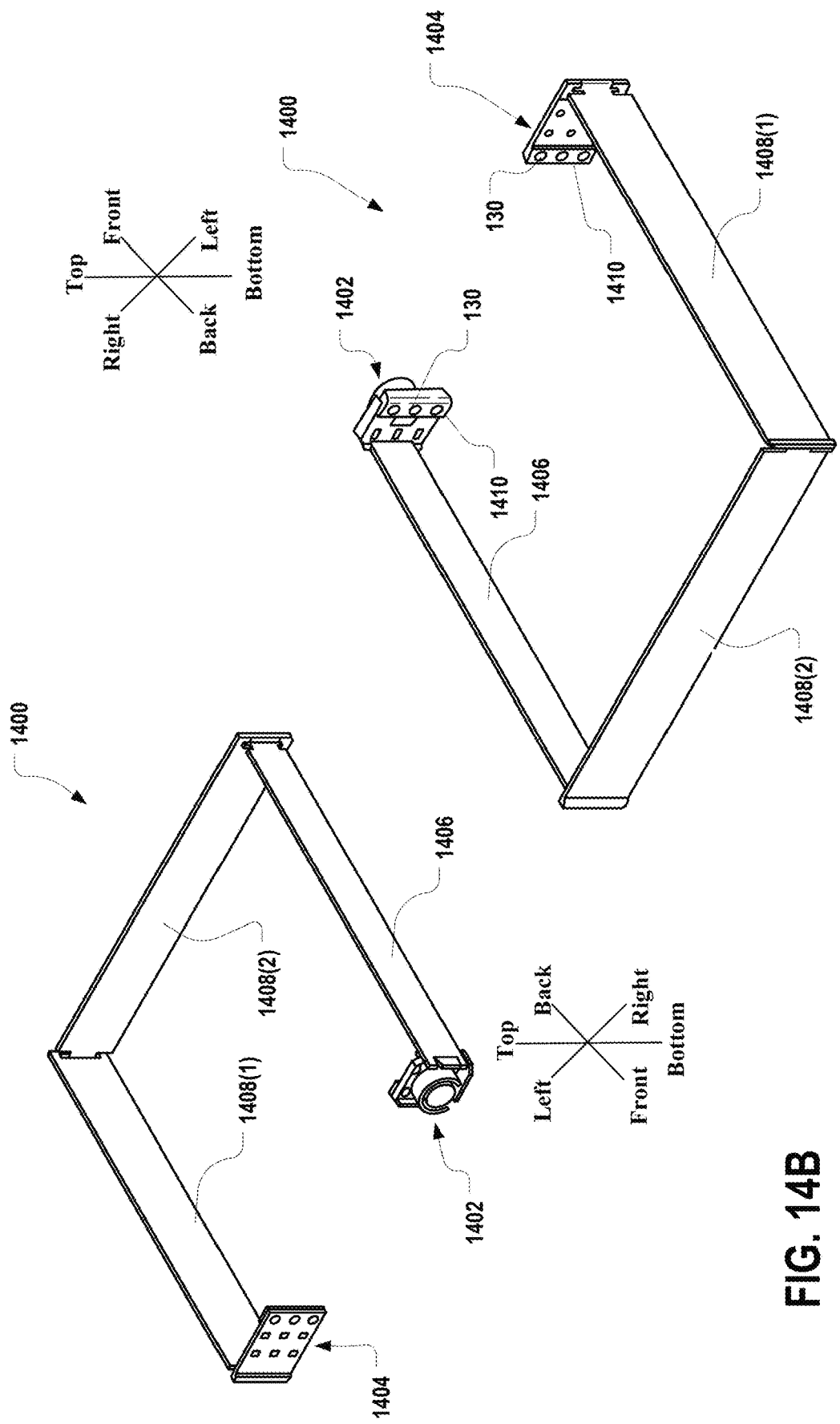

FIG. 14B is a front-right isometric view of the 3SA of FIG. 14A and in accordance with at least one implementation of the present disclosure.

FIG. 14C is a back-left isometric view of the 3SA of FIG. 14A and in accordance with at least one implementation of the present disclosure.

Figure 15A:
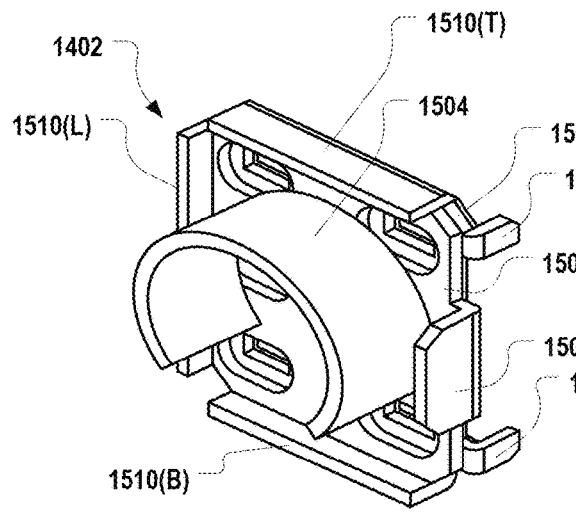

FIG. 15A is a front-right isometric view of a third security assembly lock bracket assembly ("3SA-LBA") for the 3SA of FIG. 14A and in accordance with at least one implementation of the present disclosure.

Figure 15B:
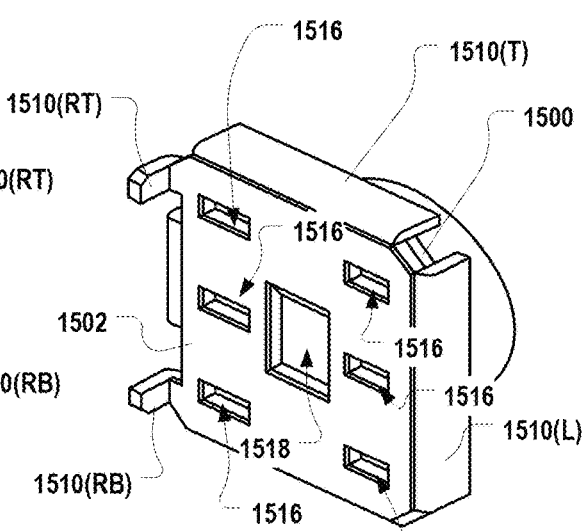

FIG. 15B is a back-left isometric view of the 3SA-LBA of FIG. 15A and FIG. 14A and in accordance with at least one implementation of the present disclosure.

Figure 15D:
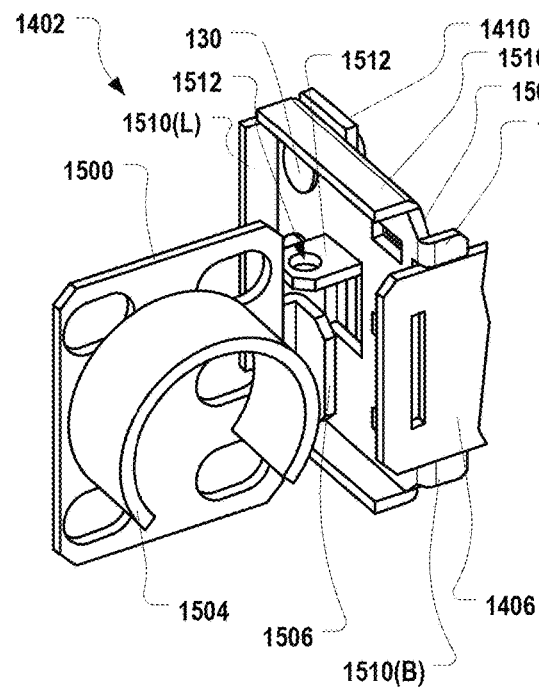
Figure 15C:
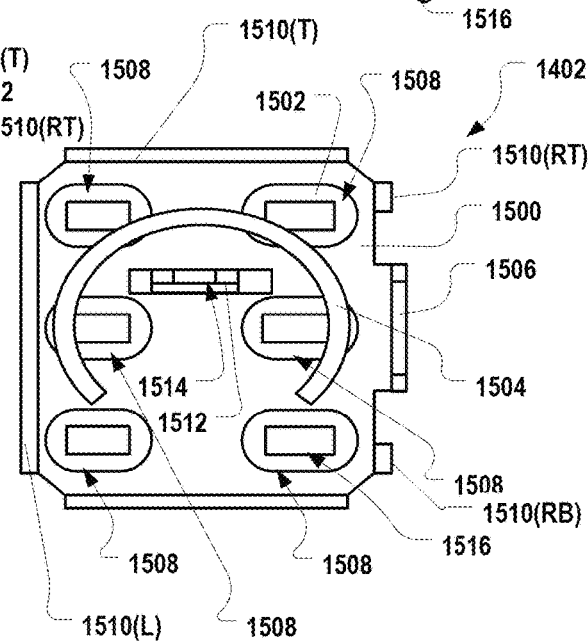

FIG. 15C is a back view of the 3SA-LBA of FIG. 15A and FIG. 14A and in accordance with at least one implementation of the present disclosure.

FIG. 15D is a front-right isometric view of the 3SALBA of FIG. 15A and FIG. 14A where a third security assembly lock bracket assembly first plate ("3SA-LBA-FP") has been removed from a third security assembly lock bracket assembly second plate ("3SA-LBA-SP") for the 3SA of FIG. 14A and in accordance with at least one implementation of the present disclosure.

FIG. 15E is a right planar view of the 3SA-LBA of FIG. 15A and FIG. 14A and in accordance with at least one implementation of the present disclosure.

FIG. 15F is a top planar view of the 3SA-LBA of FIG. 15A and FIG. 14A and in accordance with at least one implementation of the present disclosure.

FIG. 15G is a back planar view of the 3SA-LBA of FIG. 15A and FIG. 14A and in accordance with at least one implementation of the present disclosure.

FIG. 15H is a left planar view of the 3SA-LBA of FIG. 15A and FIG. 14A and in accordance with at least one implementation of the present disclosure.

FIG. 15I is a bottom planar view of the 3SA-LBA of FIG. 15A and FIG. 14A and in accordance with at least one implementation of the present disclosure.

FIG. 16A is a top planar view of a third security assembly fixed bracket assembly ("3SA-FBA") for the 3SA of FIG. 14A and in accordance with at least one implementation of the present disclosure.

FIG. 16B is a right planar view of the 3SA-FBA of FIG. 16A and FIG. 14A and in accordance with at least one implementation of the present disclosure.

FIG. 16C is a back planar view of the 3SA-FBA of FIG. 16A and FIG. 14A and in accordance with at least one implementation of the present disclosure.

FIG. 16D is a left planar view of the 3SA-FBA of FIG. 16A and FIG. 14A and in accordance with at least one implementation of the present disclosure.

FIG. 16E is a bottom planar view of the 3SA-FBA of FIG. 16A and FIG. 14A and in accordance with at least one implementation of the present disclosure.

FIG. 16F is a front planar view of the 3SA-FBA of FIG. 16A and FIG. 14A and in accordance with at least one implementation of the present disclosure.

Figures 17A, 17B, 17C:
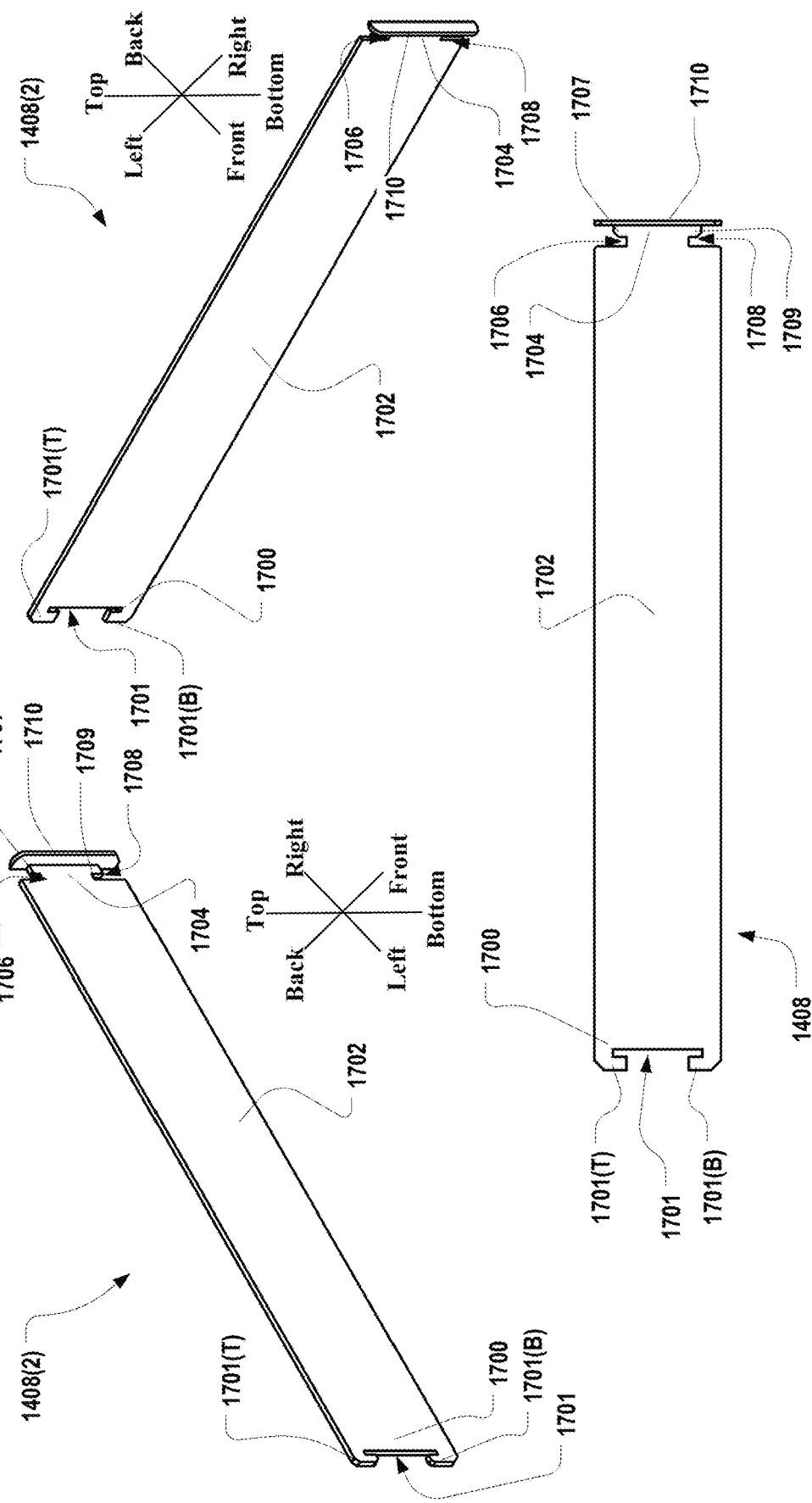

FIG. 17A is a left-front isometric view of a third security assembly side arm ("3SA-SA") of the 3SA of FIG. 14A and in accordance with at least one implementation of the present disclosure.

FIG. 17B is a front-right isometric view of the 3SA-SA of FIG. 17A and of FIG. 14A and in accordance with at least one implementation of the present disclosure.

FIG. 17C is a front planar view of the 3SA-SA of FIG. 17A and of FIG. 14A and in accordance with at least one implementation of the present disclosure.

FIG. 17D is an enlarged right-back isometric view of a T-head portion of the 3SA-SA of FIG. 17 and of FIG. 14A and in accordance with at least one implementation of the present disclosure.

FIG. 17E is an enlarged back-right isometric view of the T-head portion of the 3SA-SA of FIG. 17D as being initially mated with a channel portion of the 3SASA of FIG. 17 and of FIG. 14A and in accordance with at least one implementation of the present disclosure.

FIG. 17F is an enlarged back-right isometric view of the T-head portion of the 3SA-SA of FIG. 17D as being finally mated with the channel portion of the 3SA-SA of FIG. 17 and of FIG. 14A and in accordance with at least one implementation of the present disclosure.

FIG. 17G is an enlarged right-back isometric view of the T-head portion of the 3SA-SA of FIG. 17D as being finally mated with the channel portion of the 3SA-SA of FIG. 17 and of FIG. 14A and in accordance with at least one implementation of the present disclosure.

FIG. 18A is a front-right isometric view of a third security assembly lock arm ("3SA-LA") of the 3SA of FIG. 14A and in accordance with at least one implementation of the present disclosure.

FIG. 18B is a right-back isometric view of the 3SA-LA of the 3SA of FIG. 18A and FIG. 14A and in accordance with at least one implementation of the present disclosure.

FIG. 18C is a right planar view the 3SA-LA of the 3SA of FIG. 14A and in accordance with at least one implementation of the present disclosure.

Figure 19:
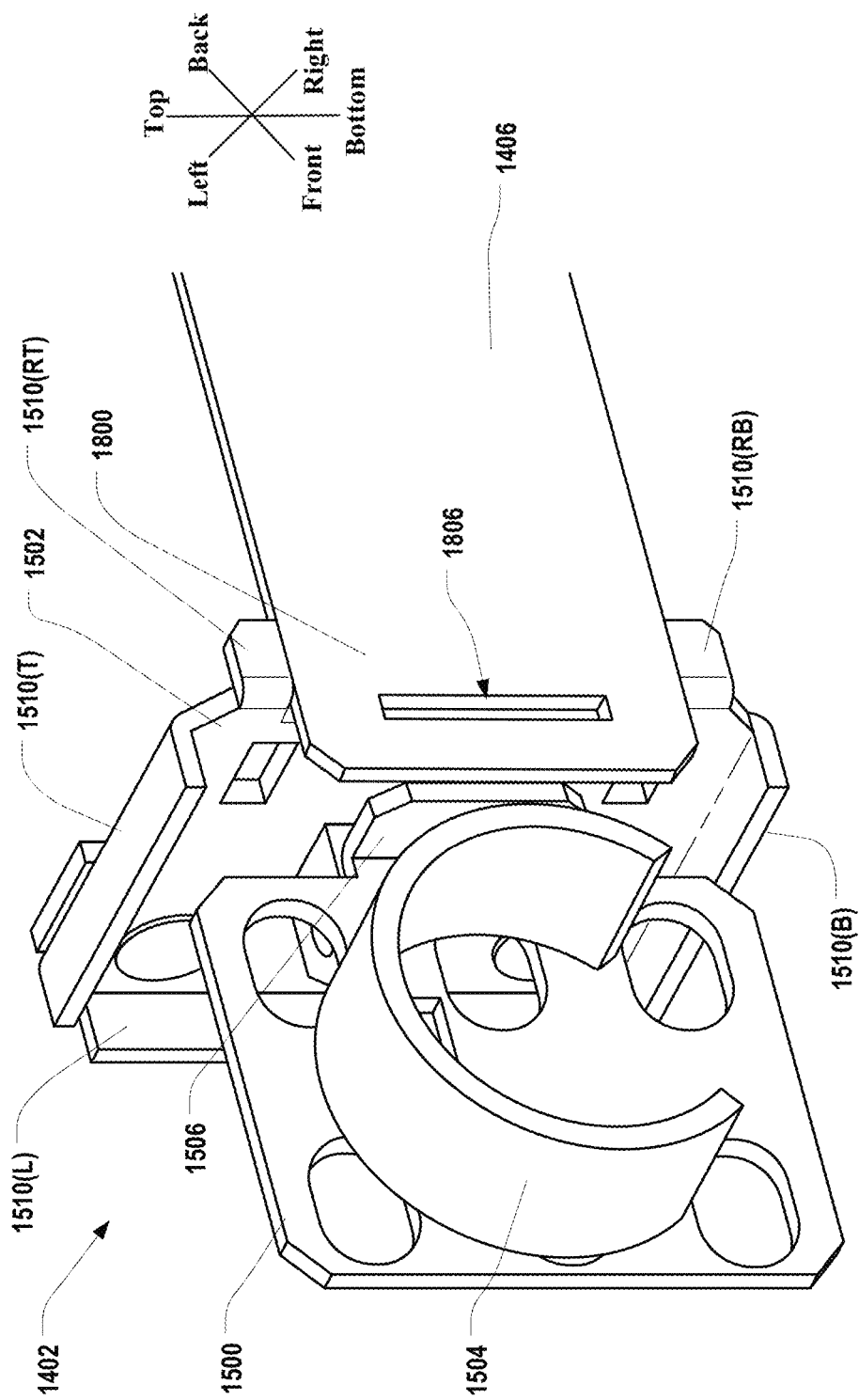

FIG. 19 is an enlarged front-right isometric view of the 3SA-LBA of FIG. 14A and in accordance with at least one implementation of the present disclosure.

Figure 20:
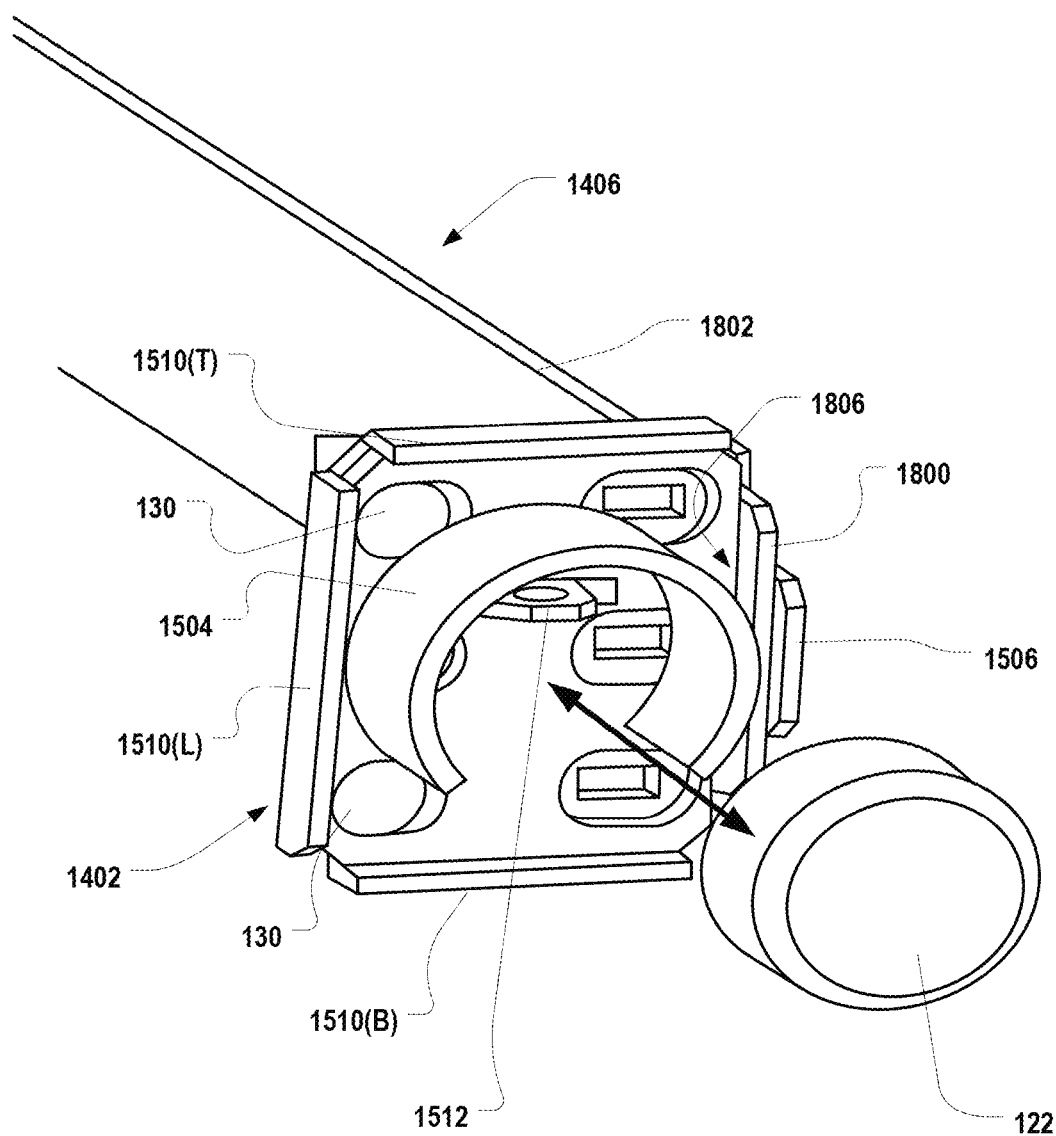

FIG. 20 is an enlarged front-left isometric view of the 3SA-LBA of FIG. 14A, as configured to receive a lock 122 and in accordance with at least one implementation of the present disclosure.

Figure 21:
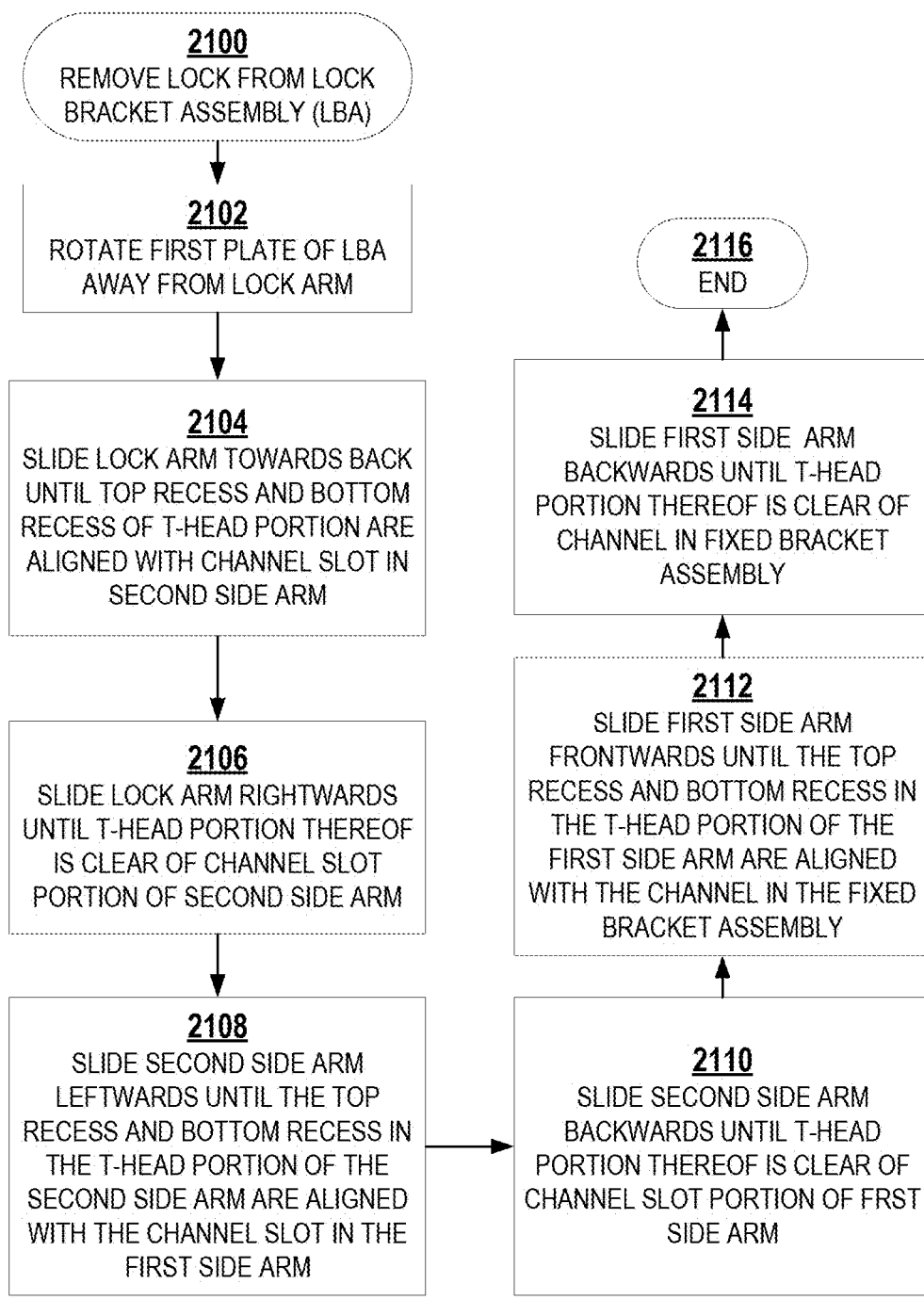

FIG. 21 is a flow chart illustrating a process for unsecuring an EC that has been secured by a 3SA configured as per FIGS. 14A-20.

DETAILED DESCRIPTION

As shown in FIGS. 1A and 1B and for at least one implementation of the present disclosure, a first security assembly (1SA) 100 may be configured to extend along one or more panels of an electronics cabinet (EC) 101; wherein the panels include, for at least one implementation, a first panel, a second panel, two or more side panels including a third panel, and a fourth panel, a top panel and a bottom panel. As shown for the purpose of illustration, an EC 101 may include; as the second panel, an EC front panel 102; as the first panel, an EC back panel 104; an EC top panel 106; an EC bottom panel 108; as a fourth panel an EC left panel 110; and as a third panel an EC right panel 112. One or more of the panels may be configured as doors which can be opened/closed and/or are otherwise removable (herein, an "operative panel") from the EC 101 so as to permit entry into a cavity formed within the EC 101. The non-operative panels may be solidly formed with other panels using known techniques, such as welding, bolts and nuts, screws, adhesives, or otherwise.

The EC 101 may be configured to provide any given level of protection for one or more interior components (and/or exterior components) against wind, moisture, temperature, electromagnetic signals, or otherwise. Operative panels may be affixed to other panels, including other operative panels and/or other non-operative panels, using hinges (not shown), door latching mechanisms, or the like. Operative panels may be secured against unauthorized opening by locking mechanisms or the like—the use and configuration thereof being beyond the scope of the present disclosure.

An EC 101 may have any given configuration, with a rectangular form being shown in FIGS. 1A and 1B for purposes of illustration. The EC 101 may have a height 124, width 126, and length 128.

For at least one implementation, the 1SA 100 may be configured to extend about any number of sides, portions, panels, members, or the like of an EC 101. As shown in FIGS. 1A and 1B, an 1SA 100 extends from the EC front panel 102, along the EC right panel 112, further along the EC back panel 104 and to the EC left panel 110. Other configurations may be used in other implementations of the present disclosure.

As shown in FIGS. 1A and 1B and for at least one implementation, the 1SA 100 may include a lock bracket assembly 114 (1SA-LBA), one or more arms such as a first arm 116(1) and a second arm 116(2), and a fixed bracket assembly 120 (1SA-FBA). A lock 122 may be used to secure the 1SA-LBA 114 to the 1SA-FBA 120 and thereby secure the EC 101 against unauthorized openings. It is to be appreciated that any security mechanism, device, system, process, or the like (herein, each individually and/or collectively a "security assembly") is subject to being breached by those having the means and time to so breach a given security assembly. Accordingly, for purposes of the present disclosure, a given EC 101 or the like is considered to be secured by an implementation of the present disclosure when the means and times needed, by an ordinary person to break a given lock 122 used with an implementation of the present disclosure, are used to otherwise gain access to the given EC 101 by cutting, drilling, breaking, or otherwise overcoming an element of a security assembly of the present disclosure such as the 1SA-LBA, 1SA-FBA and/or one or more arms 114/116 used therewith. Accordingly, implementations of the present disclosure may include elements that have substantially the same degree of hardening (or the like) as provided by a given lock used therewith.

For at least one implementation, one or more elements of an 1SA 100, 2SA 1000, and/or a 3SA 1400 meet and/or exceed the American National Standards Institute ("ANSI") Grade 1 security level. For at least one implementation, the lock 122 is a puck lock As further shown in FIGS. 1A and 1B, mounting hardware 130 may be used to fasten elements of the 1SA 100 and/or 2A 1000 to an EC 101. For at least one implementation, the hardware 130 utilized for a given implementation also meets and/or exceeds a given security level used with a given cabinet security assembly, such as the 1SA 100, 2SA 1000, or 3SA 1400. For at least one implementation, the mounting hardware 130 meets the ANSI Grade 1 security level. For at least one implementation, elements of a 1SA 100, 2SA 1000, and/or 3SA 1400 may be fastened to the EC 101 by use of any number of mounting hardware members. As used herein, a mounting hardware member may include any form of fastener(s) configured to secure a first member to a second member with non-limiting examples including nuts and bolts, washers, lock washer, screws, adhesives, welds, or the like.

As shown in FIGS. 6A-6H, the arm 116 (1SA-Arm) includes a medial portion 600, a distal portion 602 and a proximal portion 604. The 1SA-Arm 116 may have any length, width, and thickness, as used for a given implementation. The 1SA-Arm 116 may be configured of steel, hardened steel, titanium, graphite, or any given material. The distal portion 602 may include an "arm slot" 606 which is configured and sized to receive an "arm elbow" 608 formed at the proximal portion 604 of an arm 116.

As shown in FIGS. 2A-2L and for at least one implementation of the 1SA 100, the fixed bracket assembly 120 (1SA-FBA) may include a backing plate 200 ("1SA-BA-BP") 200, one or more holes 202 and a slot 204 ("1SA-FBA-FP-S"). The slot 204 (1SA-FBA-FP-S) may be configured to receive the arm elbow 608 (as shown in FIGS. 6A-6H). The holes 202 may be configured to receive mounting hardware 130. For at least one implementation, the holes 202 may be configured to as square holes which inhibit rotation of mounting hardware inserted therein, such as a square neck carriage bolt. The mounting hardware 130 may include other elements which inhibit removal thereof, when inserted into a hole 202. The backing plate 200 (1SA-FBA-BP) may be used to further secure the fixed bracket assembly 120 (1SA-FBA) to an EC 101 member, such as an EC front panel 102. The fixed bracket assembly 120 (1SA-FBA) may include an array of holes including a plurality of horizontal rows and a plurality of vertical columns of holes 202, with the plurality of rows of holes 202 being positioned so as to allow attachment of the fixed bracket assembly 120 (1SA-FBA) to an EC 101 panel without mounting hardware 130 impinging upon other elements of an EC 101, such as thermal barriers, moisture barriers, electronic cabling, electronic devices, or the like. Unlike prior art implementations where only a limited number of holes are provided for mounting a latch plate assembly to another member, implementations of the present disclosure may include multiple rows of holes 202 in the fixed bracket assembly 120 (1SA-FBA) which facilitate attachment thereof to an EC 101 panel using any given layout pattern of mounting hardware, as shown for example, in FIG. 2L.

As shown in FIGS. 3A-3C and for at least one implementation of the 1SA 100, a lock bracket assembly 114 (1SA-LBA) may include a first lock plate 300 ("1SA-LBA-1LP") and a second lock plate 312 ("1SA-LBA-2LP"). Elements of the first lock plate 300 (1SA-LBA-1LP) are further shown in FIGS. 4A-4I. Elements of the second lock plate 312 (1SA-LBA-2LP) are further shown in FIGS. 5A-5I.

The first lock plate 300 (1SA-LBA-1LP) may include a lock guard 302 ("1SA-LBA-1LP-LG"), a hasp slot 304 ("1SA-LBA-1LP-HS"), a first extending member 306 ("1SA-LBA-1LP-1E"), a second extending member 308 ("1SA-LBA-1LP-2E"), where the 1SA-LBA-1LP-1E and 1SA-LBA-1LP-2 form a right angle.

The second lock plate 312 (LBA-2LP) may include a second extending member 318 ("1SA-LBA-2LP-2E"), and a hasp 320 ("LBA-2LP-H") which includes a hasp hole 322 ("1SA-LBA-2LP-HH").

The lock guard 302 (LBA-1FL-LG) may be configured for operation with a lock of any given size, shape, and configuration. As shown and for at least one non-limiting implementation, the lock guard 302 may be configured for use with a puck lock.

The hasp slot 304 (1SA-LBA-1LP-HS) may be configured to accept insertion therein of the hasp 320 (1SA-LBA-1LP-H).

The first extending member 306 (1SA-LBA-1LP-1E) and second extending member 308 (1SA-LBA-1LP-2E) collectively may be configured for insertion into the arm slot 606 of the arm 116.

The second lock plate 312 (1SA-LBA-2LP) may include any number of holes 202 through which mounting hardware 130 may be inserted to secure the second lock plate 312 (1SA-LBA-2LP) to an EC 101 panel, such as the EC front panel 102, which may be, for example, a door or the like. An LBA backing plate 200 (which may be configured similarly to the 1SA-FBA-BP) may be used to further secure a second lock plate 312 (1SA-LBA-2 LB) to an EC 101 panel.

The second extending member 318 (1SA-LBA-2LP-2E) may be configured to extend above and below an arm 116 attached to the first lock plate 300 (1SA-LBA-1LP).

The hasp hole 322 (1SA-LBA-2LP-HH) may be configured to accept a shackle for a lock 122. The hasp hole 322 may be any given size and sizing thereof may be determined in view of a given lock 122 to be used for a given implementation of the present disclosure.

As shown in FIGS. 7 and 8, when the 1SA 100 is configured in a closed/secured configuration about an EC (not shown), the following configurations exist:
 a. the 1SA-LBA-1LP-2E 308 protrudes through the arm slot 606 of a first arm 116(1);
 b. the 1SA-LBA-1LP 300 and 1SA-LBA-2LP 312 are co-planar;
 c. a back side of the 1SA-LBA-1LP 300 abuts a front side of the 1SA-LBA-2LP 312;
 d. mounting hardware 130 attaches the 1SA-LBA-2LP 312 to the EC panel (not shown) are not accessible (they are behind the first lock plate 300 (1SA-LBA-1LP);
 e. access to a lock 122 (such as a puck lock) is limited by the lock guard 302 (1SA-LBA-1LP-LG);
 f. an arm elbow 608 extends through the slot 204 (1SA-FBA-FP-S);
 g. mounting hardware 130 attaches the 1SA-FBA to another panel of the EC (not shown);
 h. the mounting hardware used to attach the 1SA-LBA to the EC is not removable from the exterior of the EC; and
 i. any number of arms 116 may interlocked, by insertion of an arm elbow 608 for a given arm 116 into an arm slot 606 of another arm 116, such that the 1SA 100 may extend along two or more panels of an EC 100.

As shown in FIGS. 9A-9J and in stepwise manner, a process for opening an EC 101 secured by a locked 1SA 100 may include, per Operation 900 and as illustrated in FIG. 9A, removing a lock 122 from the 1SA. Upon removal, the lock 122 may be placed aside for later use. Removal of the lock 122 may include insertion of a key (not shown), providing of a code, or otherwise.

As per Operation 902 and as illustrated in FIG. 9B, the process may include rotating the 1SA-LBA-1 LB 300 outwards and away from the 1SA-LBA-2 LB 312. Upon rotating the 1SA-LBA-1 LB 300 outwards it is to be appreciated that a given panel to which the 1SA-LBA-2 LB 312 is attached may be free to open (if otherwise openable). For example, when the 1SA-LBA-2 LB 312 is attached to a non-hinged portion of a door panel, upon rotation of the 1SA-LBA-1 LB 300 outwards and away from the 1SA-LBA-2 LB 312, the door panel should be free to open (when other locking mechanisms are not otherwise used to secure the door). When the EC panel attached to the 1SA-LBA-2 LB 312 is not a door panel, the process may continue.

As per Operation 904 and as illustrated in FIGS. 9C and 9D, the process may include sliding the 1SA-LBA-1 LB 300 leftwards (as per the coordinate system of FIG. 1A) until the 1SA-FBA-1 LB-2EB 308 is no longer protruding through the arm slot 606 of a given arm 116. Upon so sliding, the 1SA-LBA-1 LB 300 may be placed aside for later use. It is to be appreciated that Operation 904 may not be performed in implementations where the arm 116 into which the 1SA-LBA-1 LB-2EB 308 otherwise protrudes is short (such as less than three (3) meters long). Further, when an arm 116 is short, sliding of the 1SA-LBA-1 LB-2EB 308 out and through the arm slot 606 may be inhibited by bolts, welded plates or the like which inhibit slidable removal of a given 1SA-LBA-1 LB 300 relative to a given arm 116, such as the first arm 116(1), but do not inhibit rotation of the 1SA-LBA-1 LB 300 relative to the given arm 116.

As per Operation 906 and as illustrated in FIGS. 9E and 9F, the process may include rotating of the first arm 116(1), away from the 1SA-LBA-2 LB 312 (and thereby away from the EC (not shown)). The first arm 116(1) may be rotated until substantially parallel to the second arm 116(2).

As per Operation 908 and as illustrated in FIGS. 9G and 9H, the process may include sliding an arm elbow 608 of the first arm 116(1) out of an arm slot 606 of the second arm 116(2). The sliding may include rotation and/or other movements of the first arm 116(1) relative to the second arm 116(2). Upon removal, the first arm 116(1) may be placed aside for later use.

As per Operation 910 and as illustrated in FIGS. 9I and 9J, the process may include sliding the second arm 116(2) through the 1SA-FBA-S 204 of the 1SA-FBA 120 until clear. Upon removal, the second arm 116(2) may be placed aside for later use. Upon completion of Operation 910, the process is complete with regards to an EC 100 secured by an 1SA 100 that includes two arms 116. It is to be appreciated that when three or more arms 116 are utilized to secure a given EC 101, Operation 908 may be repeated, as necessary.

For at least one implementation, a process for securing an EC 101 using a 1SA 100 may include performing one or more of Operations 900-910 in a reverse order.

As shown in FIG. 10 and for at least one implementation of the present disclosure, a second security assembly 1000 (2SA) may include a first lock bracket 1002 ("2SA-1 LB") 1002 and a second lock bracket 1020 ("2SA-2 LB").

For at least one implementation and as further shown in FIGS. 11A-11I, the first lock bracket 1002 (2SA-1 LB) may include a first plate 1004 ("2SA-1 LB-FP") that is coupled to a second plate 1006 ("2SA-1 LB-SP"). The second plate 1006 may include a lock guard 1008 ("2SA-1 LB-LG"). The lock guard 1008 (2SA-1 LB-LG) may be configured for operation with a lock of any given size, shape, and configuration. As shown and for at least one non-limiting implementation, the lock guard 1008 may be configured for use with a puck lock.

The second plate 1006 (2SA-1 LB-SP) may further include a hasp 1010 ("2SA-1 LB-H") that include a hasp hole 1012 ("2SA-1 LB-HH").

The first plate 1004 (2SAFB-1 LB-FP) may further include one or more holes 1014 through which mounting hardware 130 may be inserted to secure the first lock bracket 1002 (2SA-1 LB) to an EC panel (not shown). For at least one implementation, a plate 1016 may be used to further secure the first plate 1004 (2SA-1 LB-FP) to the EC panel.

For at least one implementation and as further shown in FIGS. 12A-12I, a second lock bracket 1020 (2SA-2 LB) may include a top lock guard 1022 ("2SA-2 LB-TLG") and a bottom lock guard 1024 ("2SA-2 LB-BLG"). The top lock guard 1022 (2SA-2 LB-TLG) and the bottom lock guard 1024 (2SA-2 LB-BLG) may be configured for operation with a lock of any given size, shape, and configuration. As shown and for at least one non-limiting implementation, the 2SA-2 LB top lock guard 1022 and bottom lock guard 1024 may be configured for use with a puck lock. For at least one implementation, the top lock guard 1022 and the bottom lock guard 1024 may be configured into a single lock guard.

For at least one implementation, the second lock bracket 1020 (2SA-2LB) may include any number of holes 1014 through which mounting hardware 130 may be inserted and used to secure the 2SA-2LB to a second EC panel (not shown). A second backing plate 2004 may be used to further facilitate secure attachment of the 2SA-2LB 1020 to the second EC panel.

For at least one implementation the 2SA-1 LB 1002 is secured to a first panel of an EC while the 2SA-2 LB 1020 is secured to a second panel of the EC where the second panel and the first panel share a common edge portion such as an end portion at a corner of a door, or otherwise.

For at least one implementation, the 2SA-2 LB 1020 may include a hasp 1010 ("2SA-2 LB-H") having a hasp hole 1030 ("2SA-2 LB-HH").

As shown in FIGS. 13A-13F and for at least one implementation of the present disclosure, the 2SA-1 LB 1002 and 2SA-2 LB 1020 may be configured to cooperatively engage with a shackle of a lock 122 (such as the puck lock shown in FIG. 10) and thereby secure an opening into an EC (not shown).

A process for securing an EC with a 2SA 1000 may include: aligning the 2SA-1 LB 1002 and the 2SA-2 LB 1020 on respective first and second panels of the EC; attaching the 2SA-1 LB 1002 to the first panel; attaching the 2SA-2 LB 1020 to the second panel; placing a lock onto the 2SA-1 LB hasp 1010 and the 2SA-2L hasp 1028; configuring the lock such that a shackle thereof protrudes through each of the 2SA-1L hasp 1010 and the 2SA-2 LB hasp 1028; and securing the lock (e.g., by removal of a key for use therewith).

When the 2SA 1000 is configured in a closed/secured configuration about an EC (not shown), the following configurations exist:
 a. centers of the 2SA-1 LB hasp hole 1012 and 2SA-2 LB hasp hole 1030 correspond;
 b. mounting hardware 130 attached to the 2SA-1 LB 1002 and the 2SA-2 LB 1020 are not removable absent entry into an interior portion of an EC; and
 c. access to a lock 122 (such as a puck lock) is limited by the 2SA-1 LB lock guard 1008, the 2SA-2 LB top lock guard 1022 and the 2SA-2 LB bottom lock guard 1024.

As shown in FIGS. 14A-14C and for at least one implementation of the present disclosure, a third security assembly 1400 (3SA) may include a lock bracket assembly 1402 ("3SA-LBA"), a fixed bracket assembly 1404 ("3SA-FBA"), a lock arm 1406 (3SA-LA), one or more side arms 1408 (3SA-SA), and back plate 1410 ("3SA-BP"). One or more mounting hardware (herein also referred to as "fasteners") 130 may be used to secure elements of the lock brackets assembly 1402 and the fixed bracket assembly 1404 to an EC 101 (not shown in FIGS. 14B-14C). A lock 121 may be used to further secure contents within the EC 101, when the 3SA 1400 is positioned about one or more panels of the EC 101.

As shown in FIGS. 15A-15I and for at least one implementation of the present disclosure, the lock bracket assembly 1402 (3SA-LBA) may include a first plate 1500 ("3SA-LBA-FP") and a second plate 1502 ("3SA-LBA-SP").

The first plate 1500 (3SA-LBA-FP) may include a lock guard 1504 ("3SA-LBA-LG") and an elbow 1506 ("3SA-LBA-E"). The lock guard 1504 may have any configuration, including a circular configuration, as shown in FIGS. 15A-15C. The lock guard 1504 may be configured for operation with a lock of any given size, shape, and configuration. As shown and for at least one non-limiting implementation, the lock guard 1504 may be configured for use with a puck lock.

The elbow 1506 may extend from the first plate 1500 and is configured to accept a slot 1806 (as shown in FIG. 18) in the lock arm 1406 (3SA-LA). The first plate 1500 may also include a plurality of openings 1508 ("3SA-LBA-O") configured to accept protrusion of a head of a fastener 130 utilized to fasten the second plate 1502 (3SA-LBA-SP) to an EC panel.

The second plate 1502 (3SA-LBA-SP) may include one or more extensions, including a top extension 1510(T), a bottom extension 1510(B), a left extension 1510(L), a right top extension 1510(RT), and a right bottom extension 1510 (RB). The top, bottom and left extensions 1510 may be configured to accept the first plate 1500 when it is used to secure an EC. The right top and right bottom extensions may be configured to accept the lock arm 1406 (3SA-LA) when it is positioned for mating with the elbow 1506 (3SA-LBA-E) and to secure an EC. The second plate 1502 may include a hasp 1512 ("3SA-LBA-H") that includes a hasp hole 1514 ("3SA-LBA-HH"). The hasp hole 1514 may be configured to accept a shackle for a lock 122. The hasp hole 1514 may be any given size and sizing thereof may be determined in view of a given lock 122 to be used for a given implementation of the present disclosure.

The second plate 1502 may include one or more holes 1516 through which mounting hardware 130 may be inserted to secure the second plate 1502 (3SA-LBA-SP) to an EC panel (not shown). For at least one implementation, the back plate 1410 may be used to further secure the lock bracket assembly 1502 (3SA-LBA-SP) to the EC panel. The second plate 1502 may include a hasp opening 1518 configured to facilitate fastening of a lock to the lock bracket assembly 1402.

As shown in FIGS. 16A-16G and for at least one implementation of the present disclosure and for the 3SA, the fixed bracket assembly 1404 (3SA-FBA) may include a front layer 1600(F) and a back layer 1600(B), a channel 1602 and a plurality of holes 1604. The channel 1602 may be configured to accept a T-head portion 1704 of a side arm 140 (3SA-SA). The plurality of holes 1604 may be configured to accept a fastener 130 which fastens the fixed bracket assembly 1404 (3SA-FBA) to a panel of the EC 101 (as shown in FIG. 14A).

As shown in FIGS. 17A-17G and for at least one implementation of the present disclosure and for the 3SA, the side arm 1408 (3SA-SA) may include a channel portion 1700, a middle portion 1702, and a T-head portion 1704. The 3SA-SA 1408 may have any length, width, and thickness, as used for a given implementation. The 3SA-SA 1408 may be configured of steel, hardened steel, titanium, graphite, or any given material.

The channel portion 1700 may include a "channel slot" 1701 which is configured and sized to receive the T-head portion 1704 of another 3SA-SA 1408. The channel slot 1701 further includes a top extension 1701(T) and a bottom extension 1701(B). The channel portion 1700 is configured similarly to the channel 1602 in the fixed bracket assembly 1404 (3SA-FBA) to accept a T-head portion of a side arm 1408 (3SA-SA) or of a lock arm 1406 (3SA-LA).

The T-head portion 1704 may include a top recess 1706, a top extension 1707, a bottom recess 1708, a bottom extension 1709, and a ridge 1710. The top recess 1706 is configured to facilitate insertion of the T-head portion 1704 of a given side arm 1408 into the channel slot 1701 of another side arm 1408, a lock arm 1406 and/or the channel 1602 in the 3SA fixed bracket assembly 1404.

As shown in FIG. 17E, the T-head portion 1704(1) of a first side arm 1408(1), may be inserted into the channel slot 1701(2) of a second side arm 1408(2).

As shown in FIG. 17F, the first side arm 1408(1) may be slid leftwards (on the drawing) until the ridge 1710(1) of the first side arm 1408(1) comes into contact with the outward face of the second side arm 1408(2) at which instance the top extension 1707(1) and bottom extension 1709(1) of the first side arm 1408(1) respectively contact the channel top extension 1701(T)(2) and channel bottom extension 1701(B)(2) of the second side arm 1408(2) and thereby inhibit movement of the first side arm 1408(1) in the right direction, as shown in FIG. 17G, relative to the second side arm 1408(2).

As shown in FIGS. 18A-18C and FIG. 19 and for at least one implementation of the present disclosure and for the 3SA, the lock arm 1406 (3SA-LA) may include a slot portion 1800, a middle portion 1802, and a T-head portion 1804. The 3SA-LA 1406 may have any length, width, and thickness, as used for a given implementation. The 3SA-LA 1406 may be configured of steel, hardened steel, titanium, graphite, or any given material.

The slot portion 1800 includes a slot 1806 configured to accept insertion of the elbow 1506 (3SA-LBA-E) of the lock bracket assembly 1402 (as shown, e.g., in FIG. 19).

The T-head portion 1804 of the lock arm 1406 (3SA-LA) is configured similarly to the T-head portion of the side arm 1408 (3SA-SA) and includes a top recess 1808, a top extension 1810, a bottom extension 1812, a bottom recess 1814, and a ridge 1816. The top recess 1808 is configured to facilitate insertion of the T-head portion 1804 of the lock arm 1406 into the channel slot 1701 of a side arm 1408.

As shown in FIG. 20 and for at least one implementation of the present disclosure and with respect to the 3SA, a lock arm 1406 is mated with a lock bracket assembly 1402 and is ready to accept insertion of a lock 122 onto the hasp 1512 (3SA-LBA-H) and securing of an EC.

As shown in FIGS. 14A-20, when the 3SA 1400 is configured in a closed/secured configuration about an EC (not shown), the following configurations exist:

a. the elbow 1506 (3SA-LBA-E) protrudes through the slot 1806 of the lock arm 1406;
b. mounting hardware 130 attaching the 3SA to the EC re not accessible;
c. access to a lock 122 (such as a puck lock) is limited by the lock guard 1504 (3SA-LBA-LG);
d. mounting hardware 130 attaches the 3SA-FBA to another panel of the EC;
e. the lock arm 1406 and side arm 1408 extend about two or more sides of the EC;
f. the mounting hardware used to attach the 3SA-LBA and the 3SA-FBA to the EC is not removable from the exterior of the EC; and
g. any number of side arms 1408 may interlocked with another side arm 1408 until all sides of the EC, excluding the front side, are enveloped by a side arm 1408 and/or a lock arm 1406.

In stepwise manner, a process for opening an EC 101 secured by a locked 3SA 1400 may include, per Operation 2100 (with reference to FIGS. 14A-20), removing a lock 122 from the lock bracket assembly 1402 (3SA-LBA). Upon removal, the lock 122 may be placed aside for later use. Removal of the lock 122 may include insertion of a key (not shown), providing of a code, or otherwise.

As per Operation 2102, the process may include rotating the first plate 1500 of the lock bracket assembly 1402 (3SA-LBA) outwards and away from the lock arm 1406. Upon rotating the first plate 1500 outwards it is to be appreciated that a given panel to which the lock bracket assembly 1402 (3SA-LBA) is attached may be free to open (if otherwise openable).

As per Operation 2104, the process may include sliding the lock arm 1406 backwards until the top recess and bottom recess in the T-head portion of the lock arm are aligned with the channel slot in the second side arm 1408(2).

As per Operation 2106, the process may include moving the lock arm 1406 rightwards until the T-head portion thereof is clear of the channel slot portion in the second side arm 1408(2). Upon so sliding, the lock arm 1406 may be placed aside for later use.

As per Operation 2108, the process may include sliding the second side arm 1408(2) leftwards until the top recess and bottom recess in the T-head portion of the second side arm 1408(2) are aligned with the channel slot in the first side arm 1408(1).

As per Operation 2110, the process may include moving the second side arm 1408(2) backwards until the T-head portion thereof is clear of the channel slot portion in the first side arm 1408(1). Upon so sliding, the second side arm 1408(2) may be placed aside for later use.

As per Operation 2112, the process may include sliding the first side arm 1408(1) frontwards until the top recess and bottom recess in the T-head portion of the first side arm 1408(1) are aligned with the channel 1602 in the fixed bracket assembly 1404 (3SA-FBA).

As per Operation 2114, the process may include moving the first side arm 1408(1) leftwards until the T-head portion thereof is clear of the channel in the fixed bracket assembly 1404. Upon so sliding, the first side arm 1408(1) may be placed aside for later use.

Upon completion of Operation 2114, the process is complete with regards to an EC 100 secured by a 3SA 1400 that includes a first side arm 1480 (1), a second side arm 1408(2), and a lock arm 1406. It is to be appreciated that when three or more side arms 1408 are utilized to secure a given EC 101, Operations 2108-2110 may be repeated, as necessary, until all of the additional side arms have been removed.

As per Operation 2116, the process is complete and the interior of the EC 100 may be accessed, as desired, from one or more of the sides thereof.

For at least one implementation, a process for securing an EC 101 using a 3SA 1400 may include performing one or more of Operations 2100-2114 in a reverse order.

Based on design considerations, the components described above may be of substantially different shape than depicted in the figures, while operating in the same or an equivalent manner. For example, an implementation of a lock adapter may be taller, shorter, wider, thinner, or of different cross-sectional shape than depicted herein. A number of variations of the examples and implementations described above are possible. In some implementations, one or more fasteners may be eliminated by combining given components as single units. Directional references e.g., upper, lower, inner, outer, upward, downward, left, right, lateral, front, back, top, bottom, above, below, vertical, horizontal, clockwise, counterclockwise, proximal, and distal are used for identification purposes to aid the reader's understanding of the claimed subject matter, and do not create limitations, particularly as to the position, orientation, or use of the lock adapter. Connection references, e.g., attached, coupled, connected, and joined are to be construed broadly and may include intermediate members between a collection of elements and relative movement between elements unless otherwise indicated. As such, connection references do not imply that two elements are directly connected and in fixed relation to each other. The term "or" shall be interpreted to mean "and/or" rather than "exclusive or." Unless otherwise noted in the claims, stated values shall be interpreted as illustrative and shall not be taken to be limiting.

The above specification, examples and drawings provide a complete description of the structure and use of one or more non-limiting implementations of a lock adapter as defined in the claims. Although various implementations of the claimed subject matter have been described above with a given degree of particularity, or with reference to one or more individual implementations, those skilled in the art could make numerous alterations to the disclosed implementations without departing from the spirit or scope of the claimed subject matter. For example, components may be made of many varied materials, and may be colored or patterned for aesthetic purposes or for ease of assembly. Other implementations are contemplated. It is intended that all matter contained in the above description and shown in the accompanying drawings shall be interpreted as illustrative of particular implementations and not limiting. Changes in detail or structure may be made without departing from the basic elements of the subject matter as defined in the following claims.

What is claimed is:

1. A system, for securing an electronics cabinet, comprising:
    a fixed bracket assembly ("FBA") attached to a first panel of an electronics cabinet ("EC");
    a first arm having a proximal portion, a middle portion, and a distal portion; and
    a lock bracket assembly ("LBA") attached to a second panel of the EC;
    wherein the first arm, when securing the EC:
        extends across a third panel of the EC;
            wherein the third panel couples the first panel to the second panel of the EC;
        is attached at the proximal portion to the LBA; and
        is attached at the distal portion to the FBA; and
    wherein the first arm, when attached to both the LBA and the FBA, prevents opening of at least one of the first panel, the second panel, and the third panel of the EC.

2. The system of claim 1,
    wherein the FBA comprises:
        an FBA first plate ("FBA-FP") comprising:
            a plurality of FBA-FP holes configured to receive a plurality of fasteners; and
            an FBA-FP slot ("FBA-FP-S");
        an FBA second plate ("FBA-SP") comprising:
            a plurality of FBA-SP holes, aligned with one or more of the plurality of FBA-FP holes and configured to receive one or more of the plurality of fasteners;
    wherein the FBA-FP is configured for placement on an exterior side of the first panel;
    wherein the FBA-SP is configured for placement on an interior side of the first panel; and
    wherein the FBA is secured to the first panel by extending the plurality of fasteners into the FBA-FP holes, through a corresponding hole in the first panel and into the FBA-SP holes.

3. The system of claim 2,
    wherein the plurality of FBA-FP holes are aligned in an array of holes including a plurality of horizontal rows and a plurality of vertical columns; and
    wherein the FBA-SP is configured to align with holes in the array of holes that correspond to one of the vertical columns and two or more of the plurality of horizontal rows.

4. The system of claim 3,
    wherein the distal portion of the arm includes an elbow; and
    wherein the FBA-FP-S is configured to receive the elbow.

5. The system of claim 1,
    wherein the LBA comprises:
        an LBA first lock plate ("LBA-1LP");
        an LBA second lock plate ("LBA-2LP"); and
        an LBA backing plate ("LBA-BP") having a plurality of holes.

6. The system of claim 5,
    wherein the LBA-1LP comprises:
        an LBA-1LP lock guard ("LBA-1LP-LG");
        an LBA-ILP hasp slot ("LBA-1LP-HS");
        an LBA-ILP first extending member ("LBA-1LP-1E"); and
        an LBA-ILP second extending member ("LBA-1LP-2E");
        wherein the LBA-1LP-1E extends from the LBA-1LP and is connected to the LBA-1LP-2E so that LBA-1LP-2E is perpendicular to a planar surface of the LBA-1LP and forms a right angle with the LBA-1LP-1E; and
        wherein the right angle LBA-1LP-2E is configured for insertion into a slot in the first arm.

7. The system of claim 6,
    wherein the LBA-2LP comprises:
        a plurality of LBA-2LP holes configured to receive a plurality of fasteners;
        an LBA-2LP second extending member ("LBA-2LP-2E");
            wherein the LBA-2LP-2E extends perpendicularly to the LBA-2LP;
        an LBA-2LP hasp ("LBA-2LP-H") including:
            having an LBA-2LP hasp hole ("LBA-2LP-HH"); and
            wherein the LBA-2LP-H is configured to accept a lock shackle;
    wherein the LBA-2LP is configured for placement on an exterior side of the second panel;

wherein the LBA-BP is configured for placement on an interior side of the second panel; and wherein the LBA-2LP is secured to the second panel by extending the plurality of fasteners into the LBA-2LP holes, through corresponding holes in the second panel and into the LBA-BP holes.

8. The system of claim 7,
wherein the first arm further comprises:
a first arm slot configured to receive the LBA-2LP-2E; and
a first arm elbow configured for insertion into the FBA-FP-S.

9. The system of claim 8, further comprising:
a second arm having a proximal portion, a middle portion, and a distal portion; and further comprising:
a second arm slot configured to receive one of the LBA-2LP-2E and the first arm elbow; and
a second arm elbow configured for insertion into one of the first arm slot and the FBA-FP-S;
wherein the second arm, when securing the EC:
extends across a fourth panel of the EC;
wherein the fourth panel is coupled to two of the first panel, the second panel, and the third panel of the EC; and
wherein the second arm, when attached to the first arm and one of the LBA and the FBA, prevents opening of at least the fourth panel of the EC.

10. A system, for securing an electronics cabinet, comprising:
a second security assembly ("2SA") first lock bracket ("2SA-1LB") comprising:
an 2SA-1LB lock guard ("2SA-1LB-LG");
an 2SA-1LB hasp ("2SA-1LB-H") having a hasp hole ("2SA-1LB-HH") configured to accept a shackle of a lock; and
a first plurality of holes configured to each receive a fastener;
a first backing plate comprising:
a second plurality of holes configured to each receive a fastener;
wherein the fastener, when inserted into a corresponding combination of the first plurality of holes in the 2SA-1LB and in the second plurality of holes in the first backing plate, are configured to secure the 2SA-1LB to an exterior side of a first panel of an electronics cabinet ("EC") and the first backing plate to an interior side of the first panel;
an 2SA second lock bracket ("2SA-2LB") comprising:
an 2SA-2LB lock guard ("2SA-2LB-LG");
an 2SA-2LB hasp ("2SA-2LB-H") having a hasp hole ("2SA-1LB-HH") configured to accept the shackle of the lock; and
a third plurality of holes configured to each receive a fastener;
a second backing plate comprising:
a fourth plurality of holes configured to each receive a fastener;
wherein the fasteners inserted into the third plurality of holes in the 2SA-2LB and the fourth plurality of holes in the second backing plate are configured to secure the 2SA-2LB to an exterior side of a second panel of the EC and the second backing plate to an interior side of the second panel; and
wherein the first panel and second panel are perpendicular panels.

11. The system of claim 10,
wherein the lock is a puck lock.

12. The system of claim 10,
wherein the 2SA-2LB-H further comprises:
a top lock guard; and
a bottom lock guard.

13. The system of claim 1,
wherein the 2SA-1LB-HH and the 2SA-2LB-HH are aligned to commonly accept the shackle of the lock when the EC is secured.

14. A system, for securing an electronics cabinet, comprising:
a fixed bracket assembly ("FBA") attached to first side of a first panel of an electronics cabinet ("EC");
a side arm having a side arm channel portion and a side arm T-head portion;
a lock arm having a lock arm slot portion and a lock arm T-head portion;
a lock bracket assembly ("LBA") attached to a second side of the first panel of the EC;
wherein, when the EC is secured:
the side arm:
extends across a second panel of the EC;
is coupled by the side arm T-head portion to the FBA; and
is coupled by the side arm channel portion to the lock arm;
the lock arm:
extends across a third panel of the EC;
is coupled at the lock arm slot portion to the LBA; and
is coupled at the lock arm T-head position to the side arm;
wherein the first panel, the second panel, and the third panel enclose an interior of the EC; and
wherein the side arm and the lock arm, when attached respectively to the FBA, each other, and the LBA, are configured to receive a lock to secure the EC and, when the EC is secured, prevent opening of at least one of the first panel, the second panel, and the third panel of the EC.

15. The system of claim 14,
wherein the FBA comprises:
an FBA first plate ("FBA-FP") comprising:
a plurality of FBA-FP holes configured to receive a plurality of fasteners; and
an FBA channel in the FBA channel portion;
an FBA backing plate ("FBA-BP") comprising:
a plurality of FBA-BP holes, aligned with one or more of the plurality of FBA-FP holes and configured to receive one or more of the plurality of fasteners;
wherein the FBA-FP is configured for placement on an exterior side of the first panel;
wherein the FBA-BP is configured for placement on an interior side of the first panel; and
wherein the FBA is secured to the first panel by extending the plurality of fasteners into the FBA-FP holes, through a corresponding hole in the first panel and into the FBA-BP holes.

16. The system of claim 15,
wherein the FBA channel includes:
a channel top extension; and
a channel bottom extension; and
wherein the FBA channel is configured to receive a T-head portion of the side arm.

17. The system of claim 16,
wherein the side arm T-head portion includes:
 a top recess;
 a top extension, coupled to the top recess;
 a bottom recess;
 a bottom extension coupled to the bottom recess; and
 a ridge;
 wherein the top recess and the bottom recess are configured to facilitate insertion of the side arm into the FB channel;
 wherein the top extension and the bottom extension are configured to inhibit removal of the side arm from the FB channel; and
 wherein removal of the side arm from the FB channel is inhibited when the side arm is slid into the FB channel such that the ridge contacts a surface of the FB.

18. The system of claim 17,
wherein the LBA comprises:
 an LBA first plate ("LBA-FP") comprising:
  an elbow configured for insertion into the lock arm slot portion of the lock arm when the EC is secured;
  a hasp opening; and
  a lock guard;
 an LBA second plate ("LBA-SP") comprising:
  a plurality of LBA-FP holes configured to receive a plurality of fasteners;
  a hasp having a hasp hole configured to receive a shackle of lock;
   wherein the hasp extends through the hasp opening when the EC is secured by the lock;
 an LBA backing plate ("LBA-BP") comprising:
  a plurality of LBA-BP holes, aligned with one or more of the plurality of LBA-SP holes and configured to receive one or more of the plurality of fasteners;
 wherein the LBA-SP is configured for placement on an exterior side of the first panel;
 wherein the LBA-BP is configured for placement on an interior side of the first panel; and
 wherein the LBA-SP is secured to the LBA-BP by extending the plurality of fasteners into the LBA-SP holes, through a corresponding hole in the first panel and into the LBA-BP holes.

19. The system of claim 18,
wherein the LBA-SP further comprises:
 a plurality of extensions configured to hold the LBA-FP.

20. The system of claim 19,
wherein the lock arm T-head portion includes:
 a top recess;
 a top extension, coupled to the top recess;
 a bottom recess;
 a bottom extension coupled to the bottom recess; and
 a ridge;
 wherein the top recess and the bottom recess are configured to facilitate insertion of the lock arm into the side arm channel portion;
 wherein the top extension and the bottom extension are configured to inhibit removal of the lock arm from the side arm channel portion; and
wherein removal of the lock arm from the side arm channel portion is inhibited when the lock arm is slid into the side arm channel portion such that the ridge contacts a surface of the side arm channel portion.

* * * * *